United States Patent
Nozaki et al.

(10) Patent No.: US 9,460,769 B2
(45) Date of Patent: Oct. 4, 2016

(54) ELECTRIC FIELD FERROMAGNETIC RESONANCE EXCITATION METHOD AND MAGNETIC FUNCTION ELEMENT EMPLOYING SAME

(75) Inventors: Takayuki Nozaki, Ibaraki (JP); Yoshishige Suzuki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 287 days.

(21) Appl. No.: 14/240,158

(22) PCT Filed: Jun. 18, 2012

(86) PCT No.: PCT/JP2012/065539
§ 371 (c)(1),
(2), (4) Date: Nov. 24, 2014

(87) PCT Pub. No.: WO2013/027479
PCT Pub. Date: Feb. 28, 2013

(65) Prior Publication Data
US 2015/0085569 A1    Mar. 26, 2015

(30) Foreign Application Priority Data
Aug. 23, 2011 (JP) .................... 2011-181654

(51) Int. Cl.
*G11B 5/147* (2006.01)
*G11C 11/16* (2006.01)
(Continued)

(52) U.S. Cl.
CPC ............ *G11C 11/1675* (2013.01); *B82Y 40/00* (2013.01); *G11B 5/147* (2013.01);
(Continued)

(58) Field of Classification Search
CPC ......... G11B 5/147; G11B 5/23; G11B 5/187; G11C 11/16; G11C 11/1675
USPC .............. 360/125.3, 125.03, 125.09, 125.04, 360/125.17, 125.12, 125.16, 125.06, 360/125.15; 365/158; 324/301
See application file for complete search history.

(56) References Cited

U.S. PATENT DOCUMENTS 5,543,973 A * 8/1996 Moriyama ............. G11B 5/865
                                                360/17
6,339,543 B1   1/2002 Shimada et al.
(Continued)

FOREIGN PATENT DOCUMENTS

EP    2 209 123 A1    7/2010
JP    2001-093273 A1  4/2001
(Continued)

OTHER PUBLICATIONS

Chappert et al., The emergence of spin electronics in data storage, Nature Materials, Nov. 2007, pp. 813-823, vol. 6, Nature Publishing Group.
(Continued)

*Primary Examiner* — Allen T Cao
(74) *Attorney, Agent, or Firm* — Wolf, Greenfield & Sacks, P.C.

(57) ABSTRACT

To realize an electric field-driven type ferromagnetic resonance excitation method of low power consumption using an electric field as drive power, and provide a spin wave signal generation element and a spin current signal generation element using the method, a logic element using the elements, and a magnetic function element such as a high-frequency detection element and a magnetic recording device using the method. A magnetic field having a specific magnetic field application angle and magnetic field strength is applied to a laminate structure in which an ultrathin ferromagnetic layer sufficiently thin so that an electric field shield effect by conduction electrons does not occur and a magnetic anisotropy control layer are directly stacked on each other and an insulation barrier layer and an electrode layer are arranged in order on an ultrathin ferromagnetic layer side. An electric field having a high-frequency component of a magnetic resonance frequency is then applied between the magnetic anisotropy control layer and the electrode layer, thereby efficiently exciting ferromagnetic resonance in the ultrathin ferromagnetic layer.

23 Claims, 14 Drawing Sheets

(51) Int. Cl.
  H01L 29/66    (2006.01)
  H01L 43/08    (2006.01)
  H03B 15/00    (2006.01)
  H01F 41/30    (2006.01)
  B82Y 40/00    (2011.01)
  H01F 10/32    (2006.01)

(52) U.S. Cl.
  CPC ......... *H01F 10/329* (2013.01); *H01F 41/303* (2013.01); *H01L 29/66984* (2013.01); *H01L 43/08* (2013.01); *H03B 15/006* (2013.01); *H01F 10/3254* (2013.01); *H01F 10/3286* (2013.01)

(56) References Cited

U.S. PATENT DOCUMENTS

| | | | |
|---|---|---|---|
| 8,416,539 B2* | 4/2013 | Carey | B82Y 10/00 360/324.11 |
| 2004/0085614 A1* | 5/2004 | Elezzabi | G02F 1/095 359/280 |
| 2008/0150643 A1 | 6/2008 | Suzuki et al. | |
| 2009/0015376 A1* | 1/2009 | Xiang | G06K 19/0672 340/10.1 |
| 2009/0196818 A1 | 8/2009 | Tokura et al. | |
| 2010/0142088 A1 | 6/2010 | Iwasaki et al. | |
| 2010/0225312 A1 | 9/2010 | Nakamura et al. | |
| 2011/0049659 A1 | 3/2011 | Suzuki et al. | |
| 2011/0075476 A1 | 3/2011 | Kajiwara et al. | |
| 2012/0133007 A1 | 5/2012 | Kimura et al. | |

FOREIGN PATENT DOCUMENTS

| JP | 2006-295908 A | 10/2006 |
|---|---|---|
| JP | 2009-295824 A | 12/2009 |
| JP | 2010-092527 A | 4/2010 |
| JP | 2010-166054 A | 7/2010 |
| JP | 2010-205975 A | 9/2010 |
| JP | 2011-082388 A | 4/2011 |
| WO | WO 2007/037625 A | 4/2007 |
| WO | WO 2007/135817 A1 | 11/2007 |
| WO | WO 2009/133650 A1 | 11/2009 |
| WO | WO 2011/004891 A1 | 1/2011 |

OTHER PUBLICATIONS

Chu et al., Electric-field control of local ferromagnetism using a magnetoelectric multiferroic, Nature Materials, Jun. 2008, pp. 478-482, vol. 6 and Aug. 2008, pp. 678, vol. 7, Nature Publishing Group.

Deac et al., Bias-driven high-power microwave emission from MgO-based tunnel magnetoresistance devices, Nature Physics, Oct. 2008, pp. 803-809, vol. 4, Macmillan Publishers Limited.

International Preliminary Report on Patentability and English translation of the Written Opinion of the International Searching Authority for PCT/JP2012/065539, mailed Feb. 25, 2014 (12 pages).

International Search Report for PCT/JP2012/065539, mailed Sep. 18, 2012 (2 pages).

Kruglyak et al., Magnonics, Journal of Physics D: Applied Physics, Jun. 17, 2010, pp. 1-14, vol. 43, IOP Publishing Ltd.

Ohno et al., Electric-field control of ferromagnetism, Nature, Dec. 21/28, 2000, pp. 944-946, vol. 408, Macmillan Magazines Ltd.

Slonczewski, Current-driven excitation of magnetic multilayers, Journal of Magnetism and Magnetic Materials, 1996, pp. L1-L7, 159, Elsevier.

Tulapurkar et al., Spin-torque diode effect in magnetic tunnel junctions, Nature, Nov. 17, 2005, pp. 339-342, vol. 438, Nature Publishing Group.

Yuasa et al., Giant room-temperature magnetoresistance in single-crystal Fe/MgO/Fe magnetic tunnel junctions, Nature Materials, Dec. 2004, pp. 868-871, vol. 3, Nature Publishing Group.

Zhu et al., Microwave Assisted Magnetic Recording, IEEE Transactions on Magnetics, Jan. 2008, vol. 44, No. 1, pp. 125-131, IEEE.

* cited by examiner

OR operation truth table

| Input 1 | Input 2 | Output |
|---------|---------|--------|
| 0 | 0 | 0 |
| 0 | 1 | 1 |
| 1 | 0 | 1 |
| 1 | 1 | 1 |

AND operation truth table

| Input 1 | Input 2 | Output |
|---------|---------|--------|
| 0 | 0 | 0 |
| 0 | 1 | 0 |
| 1 | 0 | 0 |
| 1 | 1 | 1 |

| XOR operation truth table |||
| Input 1 | Input 2 | Output |
| --- | --- | --- |
| 0 | 0 | 0 |
| 0 | 1 | 1 |
| 1 | 0 | 1 |
| 1 | 1 | 0 |

US 9,460,769 B2

ELECTRIC FIELD FERROMAGNETIC RESONANCE EXCITATION METHOD AND MAGNETIC FUNCTION ELEMENT EMPLOYING SAME

RELATED CASE INFORMATION

This application is a 371 U.S. National Stage of International Application No. PCT/JP2012/065539, filed on Jun. 18, 2012, which is incorporated by reference herein in its entirety.

TECHNICAL FIELD

The present invention is based on a proposition of an electric field-driven type ferromagnetic resonance excitation method, and relates to a spin wave signal generation element for generating a spin wave signal and a spin current signal generation element for generating a spin current signal using the ferromagnetic resonance excitation method, and further to a magnetic function element and the like such as a function element, a logic element, a high-frequency detection element, and a magnetic recording device employing the above-mentioned method and elements.

BACKGROUND ART

A technology that forms the basis of current electronic information processing devices is the CMOS (Complementary Metal Oxide Semiconductor) technology, and continuous manufacturing process development and element miniaturization have been advanced to meet the demands of the times for high performance and large capacity. Such efforts have maintained Moore's law. In recent years, however, the miniaturization limit in the operation principle of CMOS transistors poses a real problem, and there are demands to reassess the roadmaps. Of these, the fields aimed at developing technologies based on new principles beyond the conventional CMOS technology are collectively called "beyond CMOS". A beyond CMOS technology that has received particular attention is the field called "spintronics" that is intended to create new devices through the use of not only "electric charge" but also "spin" freedom of electrons.

A typical example of a device in spintronics is a magnetoresistive effect type solid-state magnetic memory (MRAM: Magnetic Random Access Memory) (for example, see Non-Patent Document 1). In the MRAM, laminate structures including magnetic elements are arranged in a matrix. Individual element recording information is read using the magnetoresistive effect of the magnetic element. Writing information is performed by controlling the magnetization direction of the magnetic element. Since the magnetization state is substituted as the recording state, the MRAM is nonvolatile in principle, and so is expected to serve as a nonvolatile memory that can satisfy all conditions including low power consumption, high speed, large capacity, write tolerance, compatibility with semiconductors, and so on. Especially, given that nonvolatility based on magnetism can ideally reduce the standby power required for information retention to zero, the device is attached importance as an innovative technology for realizing green technology.

Recently, in the above-mentioned laminate structure, ferromagnet magnetization can be dynamically controlled more directly by using the spin angular momentum transfer effect by spin polarized current injection (see Non-Patent Document 2). A high-frequency oscillation element (see Non-Patent Document 4), a high-frequency detection element (see Non-Patent Document 5), and the like that actively use the giant magnetoresistive effect in a tunnel magnetoresistive element (Non-Patent Document 3), and not only the magnetization reversal control in the MRAM and the like, have been proposed and experimentally verified.

Meanwhile, "magnonics" has also received attention (see Patent Documents 1 and 2 and Non-Patent Document 6). Magnonics is intended to create new devices through the use of "spin wave" that propagates as wave motion with each spin precession having a different phase while mediating exchange interaction or dipolar interaction in a continuous ferromagnet.

Furthermore, research has also begun on signal transmission and magnetic function elements using "pure spin current" which is the flow of spin angular momentum without a charge current (Patent Documents 3 and 4). The pure spin current does not involve Joule heat generation, and so is expected to enable low-loss information transmission.

The mounting expectations for devices using the spin freedom of electrons mentioned above have made it important to establish a ferromagnetic resonance dynamics control method for controlling the spin state with high efficiency. Ferromagnetic resonance is excited by, under the application of a static magnetostatic field, applying a high-frequency magnetic field to a ferromagnet in the direction orthogonal to the magnetostatic field. In the case where the frequency of the applied high-frequency magnetic field matches the natural resonance frequency of the ferromagnet, the applied energy is absorbed with high efficiency and resonance dynamics are excited.

Of these magnetic devices, especially the spin wave or the pure spin current can be generated by such FMR dynamics excitation, and so its control method is critical in applied technologies.

In the magnetic recording field, too, the magnetization reversal magnetic field reduction using resonance motion has been attempted recently, and has attracted attention as a next-generation magnetic recording method (Non-Patent Document 7).

As the high-frequency magnetic field necessary for ferromagnetic resonance excitation, a current magnetic field generated by the application of an electromagnetic field using a cavity or the application of a high-frequency current to a transmission path such as a coplanar waveguide formed on a substrate has been used. However, since the magnetic field generated by such a method has a spatial distribution, for example in the case where the element scale is of the order of several hundred nm or less, an interference between adjacent elements or the like poses a problem. The use of the above-mentioned resonance excitation method employing the spin angular momentum transfer effect (see Non-Patent Document 5) enables local resonance excitation restricted within an element. However, the method using the current as the drive power, such as the current magnetic field or the spin angular momentum transfer effect, has a problem of high power consumption.

Consider power necessary for magnetization reversal control, as an example. When expressed with room-temperature energy $k_BT$ ($K_B$ is the Boltzmann constant and T is the temperature) as an index, energy necessary for magnetization reversal of a magnetic thin-film element of the order of 100 nm per side is of the order of $10^6$ to $10^7$ $k_BT$ in the case of the current magnetic field, and of the order of $10^5$ to $10^6$ $k_BT$ in the case of the spin angular momentum transfer effect. On the other hand, energy necessary for information retention for 10 years or more is about 60 $k_BT$. This demonstrates the low efficiency of the current-based spin control method.

One main breakthrough for solving such a problem is to establish a spin state control method using an electric field. Magnetization state control and in particular magnetization reversal control using an electric field have been attempted in various forms. Typical examples include: a method of connecting a magnetic thin film to a piezo element and controlling the magnetostrictive effect of the magnetic thin film with the use of the distortion by voltage application to the piezo element (see Patent Document 5); a method of controlling magnetism by carrier concentration control of a ferromagnetic semiconductor (see Non-Patent Document 8); a method using the electromagnetic effect in a single-phase multiferroic material (see Patent Document 6) and a ferromagnetic/multiferroic composite structure (Non-Patent Document 9), and so on.

However, these methods fail to establish a technology that satisfies all requirements considered necessary in terms of application, namely:

(1) capable of room-temperature operation;
(2) high repeated operation tolerance; and
(3) simple production process.

As a technology that can satisfy all of these three conditions, there is a method of directly controlling, by voltage application, the magnetic anisotropy of an ultrathin metal magnetic layer of the order of several atomic layers, and a magnetic easy axis control method and a magnetization reversal control method using this phenomenon have been proposed (Patent Document 7). A significant feature of this technology is that it has the same basic structure as a ferromagnetic tunnel junction element which is a spintronics device important in terms of application, and can be relatively easily introduced to the existing process.

These electric field control methods are, however, all limited to the electrostatic field application effect, and no ferromagnetic resonance dynamics excitation control method by high-frequency electric field application has been proposed.

If electric field-driven type ferromagnetic resonance excitation by high-frequency voltage application becomes possible, it serves as an important technology for fundamentally replacing the signal input structure of a device that uses electron spin resonance, and allows various low-power magnetic function elements to be provided.

CITATION LIST

Patent Documents

Patent Document 1: International Patent Application Publication No. WO2007/037625
Patent Document 2: Japanese Patent Application Laid-Open No. 2010-205975
Patent Document 3: Japanese Patent Application Laid-Open No. 2009-295824
Patent Document 4: International Patent Application Publication No. WO2011/004891
Patent Document 5: Japanese Patent Application Laid-Open No. 2001-93273
Patent Document 6: International Patent Application Publication No. WO2007/135817
Patent Document 7: International Patent Application Publication No. WO2009/133650

Non-Patent Documents

Non-Patent Document 1: C. Chappert et al. Nature materials, 6, 813 (2007)
Non-Patent Document 2: J. C. Slonczewski, J. Magn. Magn. Mater. 159, L1 (1996)
Non-Patent Document 3: S. Yuasa et al. Nature Materials 3, 868 (2004)
Non-Patent Document 4: A. Deac et al. Nature Phys. 4, 803 (2008)
Non-Patent Document 5: A. A. Turapurkar et al. Nature 438, 339 (2005)
Non-Patent Document 6: V. V. Kruglyak et al. J. Phys. D: Appl. Phys. 43, 264001 (2010)
Non-Patent Document 7: J. -G. Zhu et al. IEEE Trans. Magn. 44, 125 (2008)
Non-Patent Document 8: H. Ohno et al. Nature 408, 944 (2000)
Non-Patent Document 9: Y. -H. Chu et al. Nature Materials 7, 478 (2008)

SUMMARY OF THE INVENTION

Problem to be Solved by the Invention

The present invention has been made in view of the circumstances described above, and has an object of providing an electric field-driven type ferromagnetic resonance excitation method of ultimately low electrical power consumption, a spin wave/spin current signal generation element using the electric field-driven type ferromagnetic resonance excitation method, and a magnetic function element such as a logic element, a high-frequency detection element, a magnetic recording device, and the like employing the same.

Means for Solving the Problem

To solve the technical problem, the electric field ferromagnetic resonance excitation method according to the present invention takes the following technical means.

(1) a magnetic field having a specific magnetic field application angle and magnetic field strength is applied to a laminate structure in which an ultrathin ferromagnetic layer sufficiently thin so that an electric field shield effect by conduction electrons does not occur and a magnetic anisotropy control layer are directly stacked on each other and an insulation barrier layer and an electrode layer are arranged in order on the ultrathin ferromagnetic layer side, and further an electric field having a high-frequency component of a magnetic resonance frequency is applied between the magnetic anisotropy control layer and the electrode layer, thereby exciting ferromagnetic resonance in the ultrathin ferromagnetic layer.

(2) A film thickness of the ultrathin ferromagnetic layer is set to be sufficiently small thickness so that the electric field shield effect by the conduction electrons does not occur, according to a material and the film thickness of the ultrathin ferromagnetic layer, a material of the magnetic anisotropy control layer, and a material and a film thickness of the insulation barrier layer.

(3) film thickness of the ultrathin ferromagnetic layer is determined so that a maximum perpendicular magnetic anisotropy magnetic field change amount induced by applying the electric field having the high-frequency component is greater than or equal to 5% of perpendicular magnetic anisotropy of the ultrathin ferromagnetic layer, the perpendicular magnetic anisotropy being determined by a combination of the magnetic anisotropy control layer, the insulation barrier layer, and the ultrathin ferromagnetic layer.

(4) An effective diamagnetic field in a direction perpendicular to a film plane of the ultrathin ferromagnetic layer is less than or equal to 1000 (Oe), by selecting interface magnetic anisotropy or crystal magnetic anisotropy of the magnetic anisotropy control layer and the insulation barrier layer.

(5) Au, Ag, Cu, Al, Ta, Ru, Cr, Pt, Pd, or an alloy thereof is used as the magnetic anisotropy control layer.

(6) A bias magnetic layer for applying a bias magnetic field is provided in the laminate structure on a side opposite to the electrode layer, and a dc electric field and the electric field having the high-frequency component of the magnetic resonance frequency are superimposedly applied between the electrode layer and the bias magnetic layer, thereby exciting ferromagnetic resonance around an arbitrary equilibrium magnetization direction.

(7) A resistance-area value of the insulation barrier layer is greater than or equal to 10 $\Omega\mu m^2$, and a tunnel current density flowing via the insulation barrier layer during voltage application is less than or equal to $1\times10^9$ $A/m^2$.

Moreover, the spin wave signal generation element according to the present invention using the above-mentioned electric field ferromagnetic resonance excitation method takes the following means.

(8) A spin wave signal generation element includes: a laminate structure in which an ultrathin ferromagnetic layer sufficiently thin so that an electric field shield effect by conduction electrons does not occur and a magnetic anisotropy control layer are directly stacked on each other, and an insulation barrier layer and an electrode layer are arranged in sequence on the ultrathin ferromagnetic layer side; means for applying a magnetic field having a specific magnetic field application angle and magnetic field strength, to the laminate structure; and means for applying an electric field having a high-frequency component of a magnetic resonance frequency, between the magnetic anisotropy control layer and the electrode layer, wherein a spin wave locally generated by exciting ferromagnetic resonance in the ultrathin ferromagnetic layer is extracted from at least one spin wave guide formed continuously with the ultrathin ferromagnetic layer or the magnetic anisotropy control layer.

(9) The spin wave signal generation element includes a spin wave signal detection unit on the spin wave guide.

(10) The spin wave signal detection unit is formed by a high-frequency signal transmission path provided on the ultrathin ferromagnetic layer via the insulation barrier layer, and detects a signal using an induced electromotive force generated by the spin wave.

(11) The spin wave signal detection unit is formed by a laminate structure that is composed of the insulation barrier layer and a ferromagnetic layer which are formed on the ultrathin ferromagnetic layer, and uses a tunnel magnetoresistive effect via the insulation barrier layer in detecting a signal.

(12) A bias ferromagnetic layer for applying a bias magnetic field is provided in the laminate structure on a side opposite to the electrode layer, and a dc electric field and the electric field having the high-frequency component of the magnetic resonance frequency are superimposedly applied between the electrode layer and the bias ferromagnetic layer, thereby exciting ferromagnetic resonance around an arbitrary equilibrium magnetization direction and arbitrarily control a frequency of the spin wave that propagates.

(13) A laminate structure composed of the insulation barrier layer and the electrode layer is provided in a part of the spin wave guide, and a dc electric field and the electric field having the high-frequency component of the magnetic resonance frequency are applied to locally directly control magnetic anisotropy of the ultrathin ferromagnetic layer forming the spin wave guide, thereby changing wave nature of the spin wave propagating through the spin wave guide, the wave nature including any of a frequency, a wavelength, an amplitude, and a phase.

Moreover, the spin current signal generation element according to the present invention using the above-mentioned electric field ferromagnetic resonance excitation method takes the following means.

(14) A spin current signal generation element includes: a laminate structure in which an ultrathin ferromagnetic layer sufficiently thin so that an electric field shield effect by conduction electrons does not occur and a magnetic anisotropy control layer are directly stacked on each other, and an insulation barrier layer and an electrode layer are arranged in sequence on the ultrathin ferromagnetic layer side; means for applying a magnetic field having a specific magnetic field application angle and magnetic field strength, to the laminate structure; and means for applying an electric field having a high-frequency component of a magnetic resonance frequency, between the magnetic anisotropy control layer and the electrode layer, wherein a pure spin current locally generated by exciting ferromagnetic resonance in the ultrathin ferromagnetic layer is generated in the magnetic anisotropy control layer, and the magnetic anisotropy control layer serves as a spin current transmission path.

(15) A bias ferromagnetic layer for applying a bias magnetic field is provided in the laminate structure on a side opposite to the electrode layer, and a dc electric field and the electric field having the high-frequency component of the magnetic resonance frequency are superimposedly applied between the electrode layer and the bias ferromagnetic layer to excite ferromagnetic resonance around an arbitrary equilibrium magnetization direction and arbitrarily control a strength of the spin current that propagates.

(16) Au, Ag, Cu, Al, Ta, Ru, Cr, Pt, Pd, or an alloy including at least one of Au, Ag, Cu, Al, Ta, Ru, Cr, Pt, and Pd is used as the magnetic anisotropy control layer.

(17) The spin current signal generation element includes a spin current detection unit, wherein the spin current is a transmission signal, the magnetic anisotropy control layer is the spin current transmission path, and an inverse spin Hall effect is used in the magnetic anisotropy control layer.

(18) The spin current signal generation element includes a tunnel magnetoresistive element as the spin current detection unit, wherein the spin current is the transmission signal and the tunnel magnetoresistive element is formed by stacking a ferromagnetic layer, a nonmagnetic spacer layer, and a ferromagnetic layer in sequence on the spin current transmission path composed of the magnetic anisotropy control layer.

(20) A plurality of spin current function elements are combined, and the magnetization direction of the ferromagnetic layer is controlled by a composition of spin currents.

Moreover, the present invention provides the following spin wave/spin current logic element using the above-mentioned spin wave signal generation element.

(21) A spin wave logic element includes a combination of a plurality of spin wave signal generation elements according to any one of claims 8 to 13, wherein wave nature of a spin wave propagating through the spin wave guide is controlled by a signal input via each of the means for applying the electric field having the high-frequency component of the magnetic resonance frequency, thereby performing a logic operation.

Moreover, the high-frequency detection element and the magnetic recording element according to the present invention using the above-mentioned electric field ferromagnetic resonance excitation method take the following means.

(22) A high-frequency detection element includes: a laminate structure in which an ultrathin ferromagnetic layer sufficiently thin so that electric field shield effect by conduction electrons does not occur and a magnetic anisotropy control layer are directly stacked on each other, and an insulation barrier layer and an electrode layer composed of a ferromagnetic layer are arranged in sequence on the ultrathin ferromagnetic layer side; means for applying a magnetic field having a specific magnetic field application angle and magnetic field strength, to the laminate structure; and means for applying an electric field having a high-frequency component of a magnetic resonance frequency, between the magnetic anisotropy control layer and the electrode layer, wherein ferromagnetic resonance is excited by directly controlling magnetic anisotropy of the ultrathin ferromagnetic layer, and detection is performed by a dc voltage generated by combination with a tunnel magnetoresistive effect by the electrode layer composed of the ferromagnetic layer.

(23) In the high-frequency detection element, the laminate structure includes a bias ferromagnetic layer for applying a bias magnetic field, and a dc electric field and the electric field having the high-frequency component of the magnetic resonance frequency are superimposedly applied to the laminate structure to enable a detection frequency to be arbitrarily controlled.

(24) A magnetic recording device includes: a perpendicularly magnetized magnetic medium layer and a magnetic anisotropy control layer are directly stacked on each other, the perpendicularly magnetized magnetic medium layer being composed of an ultrathin ferromagnetic layer sufficiently thin so that an electric field shield effect by conduction electrons does not occur;

a high-frequency electric field assist head that is arranged on the perpendicularly magnetized magnetic medium layer side via a gap that serves as an insulation barrier layer, a magnetic field having a specific magnetic field application angle and magnetic field strength is applied by a write magnetic field head, and further ferromagnetic resonance in the perpendicular magnetic medium layer an electric field having a high-frequency component of a magnetic resonance frequency is applied between the magnetic anisotropy control layer and an electrode layer which is a tip of the high-frequency electric field assist head, therebyexciting ferromagnetic resonance in the perpendicularly magnetized magnetic medium layer, and an energy barrier necessary for magnetization reversal of the perpendicularly magnetized magnetic medium is seemingly reduced, thereby reducing a write magnetization reversal magnetic field.

Effect of the Invention

According to the present invention, merely by applying the magnetic field having the specific magnetic field application angle and magnetic field strength to the laminate structure and further by applying the electric field having the high-frequency component of the magnetic resonance frequency between the magnetic anisotropy control layer and the electrode layer, ferromagnetic resonance dynamics can be excited efficiently. The above-mentioned three conditions can thus be satisfied simultaneously.

Besides, since electric field application is used, ferromagnetic resonance can be excited with very low power. The present invention is therefore applicable as various magnetic function elements such as a high-frequency detection element, a magnetic recording device, and a logic element in which a spin wave signal generation element or a spin current signal generation element for performing ferromagnetic resonance excitation based on electric field drive is used for signal input and control.

MODE FOR CARRYING OUT THE INVENTION

The following describes an electric field-driven type ferromagnetic resonance excitation method and a magnetic function element employing the same according to the present invention, with reference to drawings.

EMBODIMENTS

Figure 1:
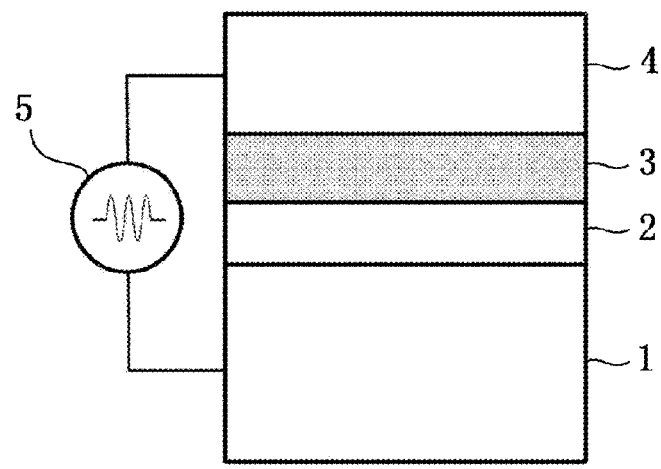
FIG. 1 is a schematic diagram of a structure of a tunnel junction element for describing the principle of the present invention.

FIG. 1 shows a basic structure for describing the principle of the present invention. A laminate structure includes a magnetic anisotropy control layer 1, an ultrathin ferromagnetic layer 2, an insulation barrier layer 3, and an upper electrode layer 4. A magnetic field with a specific magnetic field application angle and magnetic field strength can be applied to the laminate structure by a magnetic field application device installed outside. By supplying a high-frequency voltage signal 5 between the magnetic anisotropy control layer 1 and the upper electrode layer 4, ferromagnetic resonance is excited around the arbitrary magnetic field applied from outside. For the magnetic field, the north and south poles of a permanent magnet having a predetermined magnetic field strength may be arranged opposite to each other outside the laminate structure so that the magnetic field application angle with respect to the plane direction of the ultrathin ferromagnetic layer 2 can be adjusted. Moreover, a bias magnetic layer may be provided to apply a dc voltage between the magnetic anisotropy control layer 1 and the upper electrode layer 4 so that the effective magnetic field in the ultrathin ferromagnetic layer 2 can be adjusted, as described later.

The ultrathin ferromagnetic layer 2 and the magnetic anisotropy control layer 1 need to be directly stacked on each other. On the other hand, the insulation barrier layer 3 and the upper electrode layer 4 do not necessarily need to be directly stacked on the ultrathin ferromagnetic layer 2 or the magnetic anisotropy control layer 1. An electrode that is away from the ultrathin ferromagnetic layer 2 by a small air gap may be used as the upper electrode layer 4, with the air gap serving as the insulation barrier layer 3.

The high-frequency voltage signal 5 includes not only a high-frequency signal in a continuous waveform or a pulse waveform, but also a dc voltage pulse whose pulse width or rise time is a short duration (in detail, several ns or less) of approximately the inverse of a resonance frequency.

As the magnetic anisotropy control layer 1, a material that induces strong interface magnetic anisotropy in the interface with the ultrathin ferromagnetic layer 2 or a material that maintains an epitaxial relation with the ultrathin ferromagnetic layer 2 and induces strong perpendicular magnetic anisotropy deriving from crystal magnetic anisotropy in the ultrathin ferromagnetic layer 2 is effective. Its combination with the material used in the ultrathin ferromagnetic layer 2 determines an optimal structure. Specific examples of the material include: a layer made of a noble metal or transition metal element of a nonmagnetic metal material such as Au, Ag, Cu, Al, Ta, Ru, Cr, Pt, or Pd; an alloy layer including at least one of these elements; and a laminate structure thereof. A nonmagnetic insulation material whose film thickness or sheet resistance is sufficiently smaller than the condition value of the film thickness or sheet resistance of the insulation barrier layer 3 described later is also available. Specific examples of the material include a layer made of an oxide, a nitride, a fluoride, or the like including aluminum, magnesium, hafnium, cerium, strontium, tantalum, barium, zirconium, titanium, or the like.

As the ultrathin ferromagnetic layer 2, for example: Fe, Co or Ni, or an alloy layer including at least one of these elements; a layer made of a compound, of an alloy or of the like including an oxide (e.g. ferrite, garnet) or a rare-earth element such as Nd, Sm, or Tb; or a laminate structure including the above-mentioned materials may be used. The film thickness of the ultrathin ferromagnetic layer 2 needs to be sufficiently small so that an electric field shield by conduction electrons does not occur. In the basic structure in FIG. 1, the film thickness is of the order of several atomic layers.

As the insulation barrier layer 3, a barrier layer designed so that the area resistance value is greater than or equal to 10 $\Omega\mu m^2$ and the current density flowing in the element is less than or equal to $1\times10^9$ A/m$^2$ is effectively used.

Specific examples of the material include a layer made of an oxide, a nitride, a fluoride, or the like including aluminum, magnesium, hafnium, cerium, strontium, tantalum, barium, zirconium, titanium, or the like.

As the upper electrode layer 4, a nonmagnetic metal material such as Au, Ag, Cu, Al, Ta, or Ru, an alloy layer including at least one element of these nonmagnetic metal materials, or a laminate structure thereof may be used. Moreover, a ferromagnetic electrode layer may be used in the upper electrode layer 4. Specific examples of the material include the same material as the ultrathin ferromagnetic layer 2.

To efficiently excite ferromagnetic resonance by the electric field, i.e. to excite a larger precession angle by the same electric field strength, the design of the perpendicular magnetic anisotropy of the ultrathin ferromagnetic layer 2 is important.

One condition for maximizing the sensitivity of the response of magnetization dynamics to the electric field supply is that the effective diamagnetic field in the direction perpendicular to the film plane is close to zero, where the magnetic easy axis transitions between the in-film plane and perpendicular directions.

In addition, in the case where in-film plane magnetic anisotropy (e.g. crystal magnetic anisotropy, shape magnetic anisotropy) is isotropic, magnetization can have an ideal circular orbit, making high-efficiency resonance excitation possible. The control of the effective diamagnetic field in the direction perpendicular to the film plane can be designed by the materials used in the magnetic anisotropy control layer 1, the insulation barrier layer 3, and the ultrathin ferromagnetic layer 2 and their film thicknesses, and the combination of these materials determines an optimal value.

A specific example of the design value is as follows. In the case where the tilt of the interface magnetic anisotropy change by the electric field is about 30 fJ/Vm, by setting the effective diamagnetic field in the direction perpendicular to the film plane to less than or equal to 1000 (Oe), nonlinear ferromagnetic resonance excitation with a precession angle exceeding several ten degrees is possible even by an electric field less than or equal to 1 V/nm which is the dielectric breakdown voltage of a typical tunnel insulation barrier layer. Moreover the optimal value can be controlled according to the strength and angle of the magnetic field applied from outside.

The above-mentioned condition is for maximizing the precession angle. In the case of ferromagnetic resonance in a linear response area, however, the opening angle of precession is about several degrees. For excitation by a high-frequency magnetic field, it is sufficient to apply a magnetic field of about 5% of an anisotropy magnetic field. The same argument applies to excitation by an electric field. In this case, the film thickness of the ultrathin ferromagnetic layer can be increased according to the necessary opening angle.

For example, suppose the above-mentioned tilt of the interface magnetic anisotropy change is 30 fJ/Vm, and the applied electric field strength is 1 V/nm. In the case where the saturation magnetization of the ultrathin ferromagnetic layer is 1 T, the maximum value of the anisotropy magnetic field change by the electric field application is expressed as approximately 750/t (Oe) where t (nm) is the film thickness of the ultrathin ferromagnetic layer.

In such a case, for example even when the film thickness is 5 nm, the anisotropy change of approximately 150 (Oe) is induced. Regarding the effective diamagnetic field 5% of which corresponds to this change, linear ferromagnetic resonance can be excited if the effective diamagnetic field is designed to about 3 k (Oe). In the case of normal interface magnetic anisotropy, however, the effective diamagnetic field increases with the increase in film thickness, and so the optimal value is determined by the materials used in the magnetic anisotropy control layer 1, the insulation barrier layer 3, and the ultrathin ferromagnetic layer 2, their film thicknesses, and the condition of the magnetic field applied from outside, as mentioned above.

Embodiment 1

Figure 2:
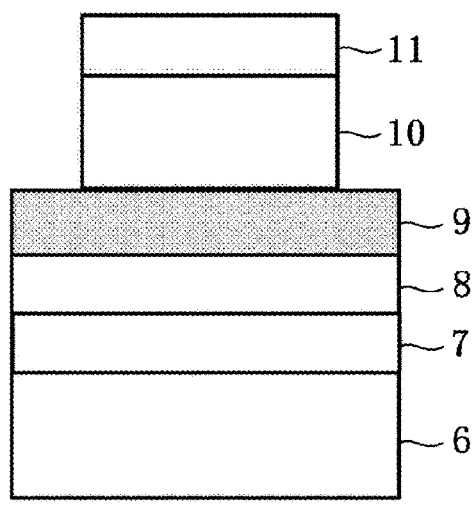
FIG. 2 is a diagram showing an example of a basic structure of an electric field ferromagnetic resonance excitation method in Embodiment 1.

FIG. 2 is a schematic diagram of a structure of a tunnel junction element in Embodiment 1 used in an experiment. A buffer layer 6, an Au layer 7 (50 nm) as the magnetic anisotropy control layer, an ultrathin FeCo layer 8 (0.54 nm) as the ultrathin ferromagnetic layer, an MgO insulation barrier layer 9 (1.9 nm), an upper Fe layer 10 (10 nm), and a cap layer 11 also serving as the electrode layer are stacked in order on an MgO(001) substrate using molecular beam epitaxy. The sides of the cap layer 11 and the upper Fe layer 10 are etched up to the MgO barrier layer 9 for microfabrication, to form a micro tunnel junction element of 1×1 µm$^2$ in cross section.

The resistance-area (RA) value is approximately 9.2 kΩµm$^2$, which is designed so that the influence (current magnetic field or spin angular momentum transfer effect) of the current on resonance excitation is sufficiently negligible.

Figure 3:
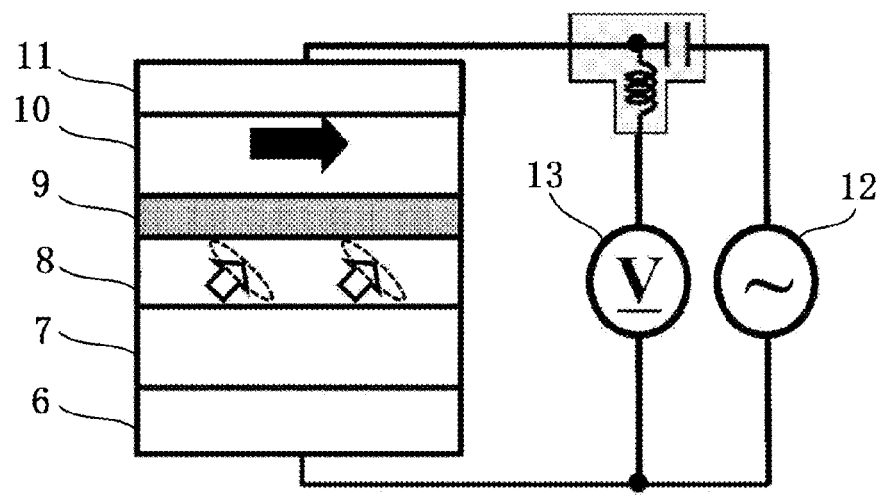
FIG. 3 is a schematic diagram of a homodyne detection and measurement circuit in Embodiment 1.

As shown in FIG. 3, homodyne detection is employed to detect ferromagnetic resonance excitation by high-frequency electric field application.

A high-frequency voltage ($V_{rf}=V_P \cos(\omega t)$: the frequency is $\omega/2\pi$) applied by a signal generator 12 excites ferromagnetic resonance in the ultrathin FeCo layer 8 under specific external magnetic field application.

The tunnel magnetic resistance via the MgO insulation barrier layer 9 depends on the magnetization relative angle between the ultrathin FeCo layer 8 and the upper Fe layer 10. Accordingly, when the generated phase difference is denoted by $\phi$, the above-mentioned resonance dynamics generate the time variation component $\delta R(t)=\delta R \cos(\theta t+\phi)$ of the element resistance.

On the other hand, the tunnel current flowing in a small amount between the cap layer 11 and the buffer layer 5 as a result of applying the high-frequency voltage signal is expressed as $I_{rf}=V_{rf}/R(\theta_0)$, where $R(\theta_0)$ is the tunnel magnetic resistance in the magnetization direction equilibrium point (the magnetization direction in a state where the high-frequency voltage is not applied, i.e. the magnetization relative angle between the ultrathin FeCo layer and the upper Fe layer).

An additional voltage component having a dc voltage and a 2ω component is generated at both ends of the element by the product of the resistance oscillation component and the tunnel current (Ohm's law). Homodyne detection is the method of measuring the dc voltage component from this by a voltmeter 13.

Figure 4A:
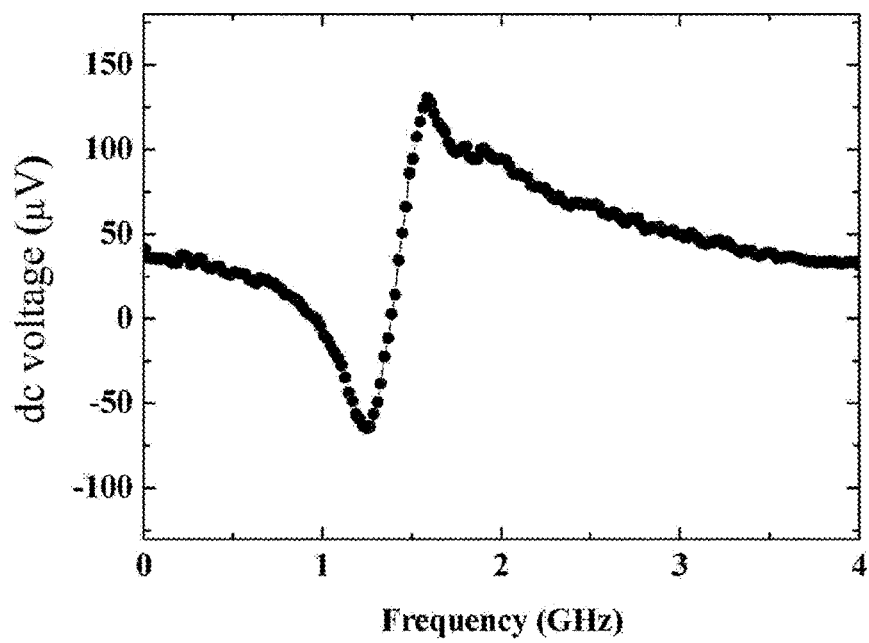
FIG. 4($a$) is a diagram showing an example of a homodyne detection signal in Embodiment 1, and FIG. 4($b$) is a diagram showing external magnetic field strength dependence of a ferromagnetic resonance frequency in Embodiment 1.

FIG. 4(a) is a diagram showing an example of a homodyne detection signal in the case of setting the power of the applied high-frequency voltage signal to 40 µW (−14 dBm) and applying the external magnetic field of 500 (Oe) with the tilt of 55 degrees from in-film plane. A dispersion spectrum whose resonance frequency is approximately 1.4 GHz is observed. The shape of the spectrum is determined depending on the direction of the torque exciting the resonance dynamics and the magnetization arrangement between the ultrathin FeCo layer 8 and the upper Fe layer 10. In this experiment, the dispersion spectrum can be explained by considering that the magnetic anisotropy change by the electric field is the source of resonance excitation.

Figure 4B:
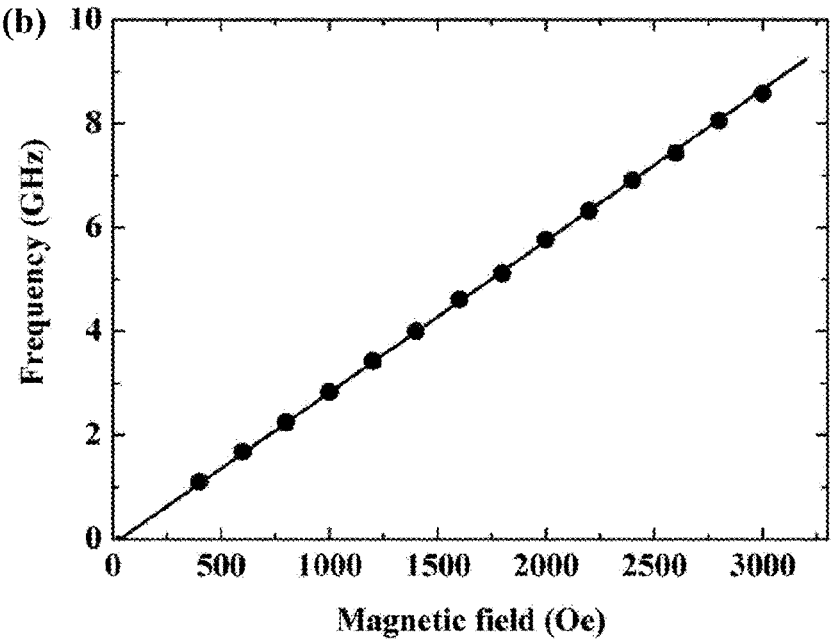

FIG. 4(b) is a diagram showing the result of examining the external magnetic field strength dependence which is an important feature of ferromagnetic resonance. It is well known that the external magnetic field dependence of the ferromagnetic resonance frequency is given by the Kittel formula, and the result obtained in this experiment is well reproduced by the theoretical formula indicated by the black line. This also demonstrates that the observed spectrum is caused by ferromagnetic resonance dynamics.

Figure 5A:
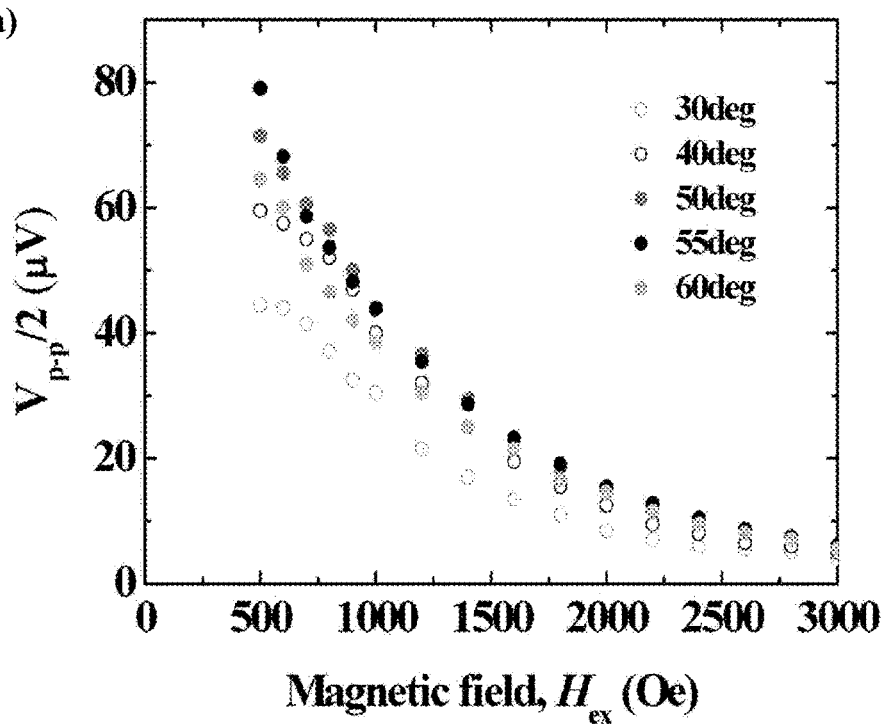
FIG. 5($a$) is a diagram showing external magnetic field application angle and magnetic field strength dependence of a homodyne detection signal strength in Embodiment 1, and FIG. 5($b$) is a diagram showing magnetic field application angle dependence of a homodyne detection signal strength in Embodiment 1.

FIG. 5(a) is a diagram showing the result of examining the external magnetic field strength dependence of the signal strength for the same element as the element shown in FIG. 2, by changing the external magnetic field application angle in the range from 30 degrees to 60 degrees and changing the external magnetic field strength for each external magnetic field application angle. In the case where the application angle is fixed, there is a common tendency that the signal strength is higher (the resonance precession angle is larger) when the magnetic field strength is lower.

It can also be understood that the signal strength significantly depends on the application angle, and takes the maximum value at the specific angle (55 degrees in this result).

Figure 5B:
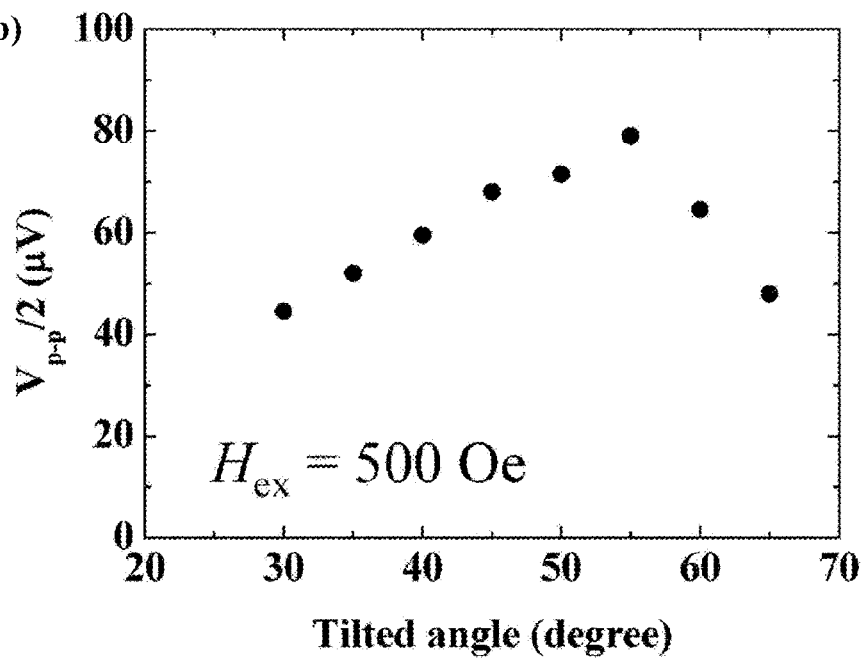

FIG. 5(b) is a diagram showing this tendency in the case where the magnetic field strength is 500 (Oe) as an example. The optimal value of the angle is determined by the materials of the magnetic anisotropy control layer and the insulation barrier layer, the material and the film thickness of the ultrathin ferromagnetic layer, and further the magnitude of the perpendicular magnetic anisotropy of the ultrathin ferromagnetic layer determined by the interface state, the magnetic anisotropy of the ultrathin ferromagnetic layer in the in-film plane direction, the element shape, and the like.

Figure 6:
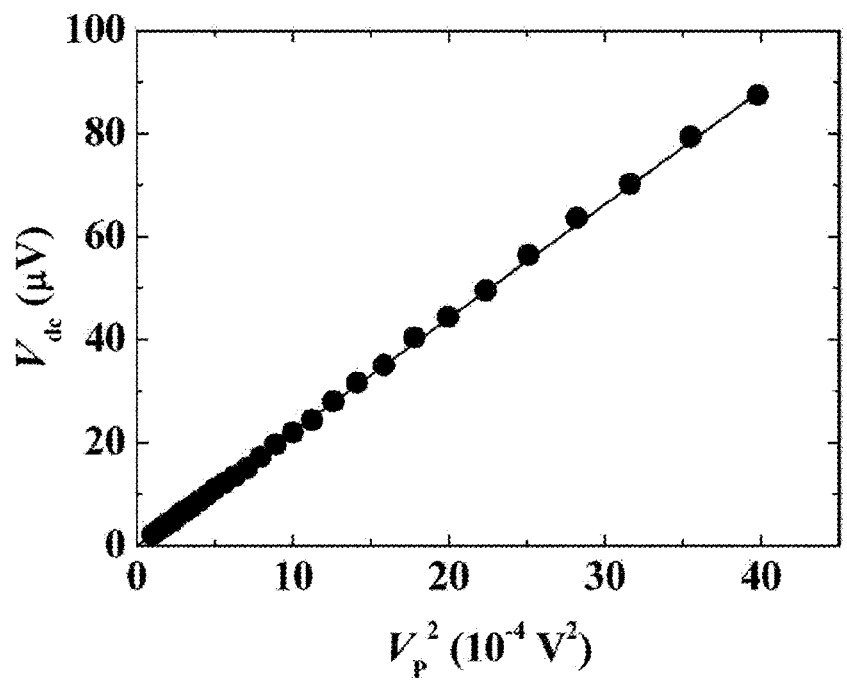
FIG. 6 is a diagram showing applied high-frequency voltage dependence of a homodyne detection signal strength in Embodiment 1.

FIG. 6 is a diagram showing the applied high-frequency power (the horizontal axis is the square of the peak voltage) dependence of the homodyne detection signal strength examined under the condition that the external magnetic field strength and the application angle are respectively fixed at 500 (Oe) and 55 degrees. This indicates that, since the resonance precession angle is proportional to the signal strength, the precession angle can be continuously controlled by the power of the input high-frequency voltage signal.

Figure 7:
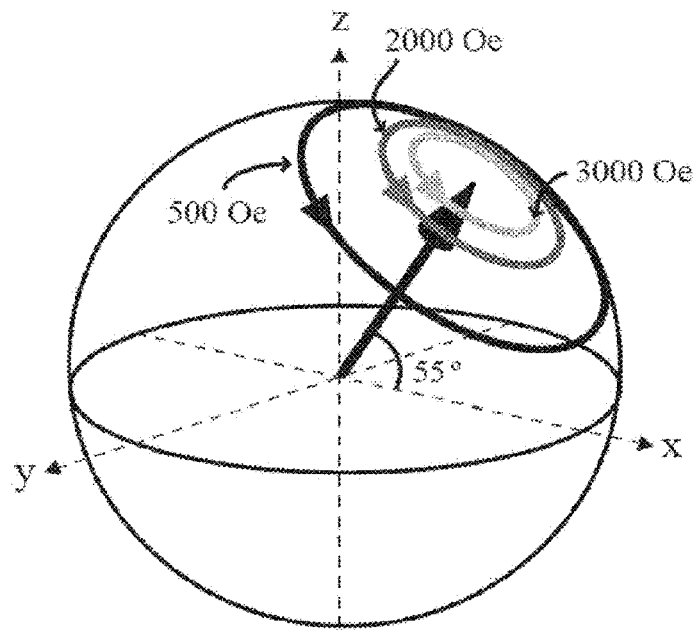
FIG. 7 is a diagram showing an example of calculating electric field ferromagnetic resonance dynamics based on a macro spin model simulation in Embodiment 1.

FIG. 7 is a diagram showing an example of an orbit of electric field ferromagnetic resonance excitation calculated in a macro spin model simulation. The basic formula is the Landau-Lifshitz-Gilbert equation, and the magnetic anisotropy change by the electric field is introduced as the effective magnetic field change in the direction (Z axis) perpendicular to the film plane. The following parameters are used in the calculation. These numeric values are all obtained by experiment.

Effective diamagnetic field in the direction perpendicular to the film plane under zero voltage: 45 (Oe)

In-film plane anisotropy magnetic field where the X axis direction is the easy axis: 15 (Oe)

Saturation magnetization: 1.44 T

Damping constant: 0.025 g factor: 2.08

Magnetic field application angle from in-plane: 55 degrees (note that the in-plane component of the external magnetic field is parallel to the X-Z plane)

Applied magnetic field strength: 500 (Oe), 2000 (Oe), 3000 (Oe)

Maximum value of the effective diamagnetic field change by high-frequency voltage signal application: 75 (Oe)

Like the tendency in the experimental result, the precession angle is larger when the applied magnetic field is smaller. The precession angle exceeding approximately 50 degrees is attained under the condition of 500 (Oe). This result indicates that an orbit which is close to a circle and has a large precession angle can be excited with high efficiency by designing the effective diamagnetic field in the direction perpendicular to the film plane to be small and also substantially equal to the in-film plane anisotropy magnetic field. In the element design for attaining a large precession angle, the materials of the magnetic anisotropy control layer and the insulation barrier layer, the material and the film thickness of the ultrathin ferromagnetic layer, and further the magnitude of the perpendicular magnetic anisotropy of the ultrathin ferromagnetic layer determined by the interface state, the magnetic anisotropy of the ultrathin ferromagnetic layer in the in-film plane direction, the element shape, and the applied external magnetic field strength and angle are important parameters, and the optimal value in each element is determined by their settings.

Embodiment 2

Figure 8:
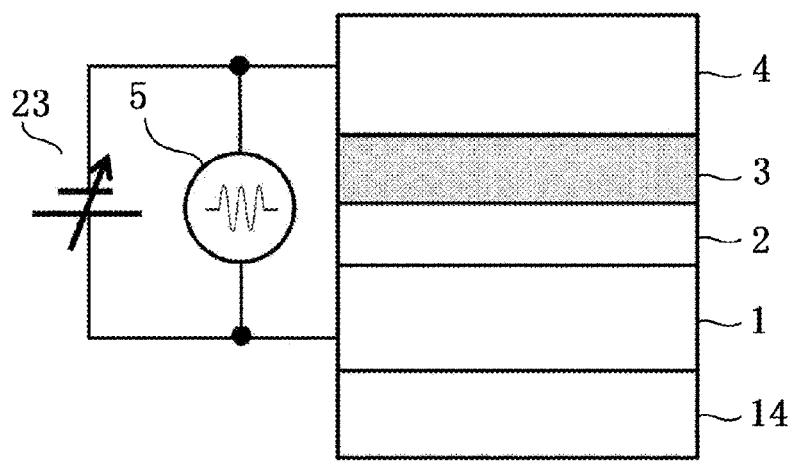
FIG. 8 is a diagram showing an example of a basic structure of a spin wave signal generation element in Embodiment 2.

FIG. 8 is a diagram showing a basic structure for implementing an electric field-driven type ferroelectric resonance excitation method according to Embodiment 2 of the present invention. A bias magnetic layer 14 is provided below the magnetic anisotropy control layer 1, in addition to the basic structure in FIG. 1. By using a leakage magnetic field from the bias magnetic layer 14, a predetermined fixed magnetic field can be applied to the ultrathin ferromagnetic layer 2 without applying the magnetic field from outside.

This bias magnetic layer 14 does not necessarily need to be adjacent to the magnetic anisotropy control layer 1, and may be provided on the upper side of the element above the insulation barrier layer 3. Specific examples of the material applicable to the bias magnetic layer 14 include: Fe, Co, or Ni; an alloy layer including at least one of these elements; a layer made of a compound, an alloy, or the like including a rare-earth element such as Nd, Sm, or Tb; and a laminate structure including the above-mentioned materials.

Another feature is that a do voltage signal 23 is superimposed in addition to the high-frequency voltage signal 5. By controlling the strength and sign of the do voltage signal 23, it is possible to control the strength relation between the bias magnetic field applied from the bias magnetic layer 14 and the magnetic anisotropy of the ultrathin ferromagnetic layer 2 and to arbitrarily control the magnetization direction of the ultrathin ferromagnetic layer without applying the magnetic field from outside.

This enables ferromagnetic resonance to be excited by the electric field in the arbitrary magnetization direction state. Here, an antiferromagnetic material may be used in the bias magnetic layer 14 to utilize an exchange coupling magnetic field. In this case, the bias magnetic layer 14 needs to be placed adjacent to the ultrathin ferromagnetic layer 2.

Embodiment 3

Figure 9:
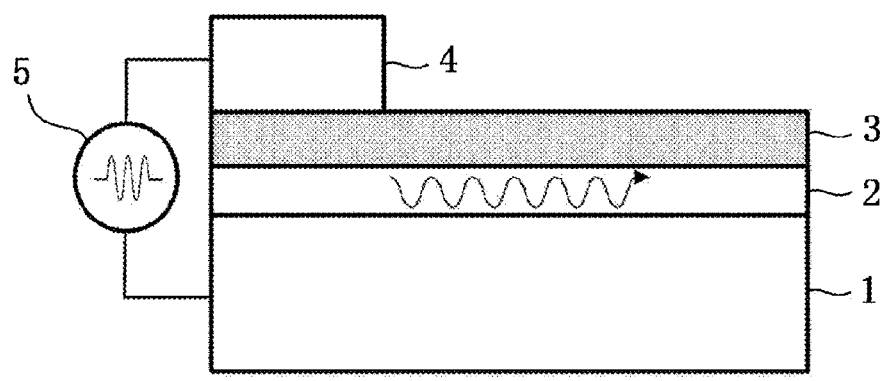
FIG. 9 is a diagram showing an example of a basic structure of a spin wave signal generation element in Embodiment 3.

FIG. 9 is a diagram showing a basic structure of a spin wave signal generation element using an electric field-driven type ferromagnetic resonance excitation method according to Embodiment 3. The spin wave signal generation element includes the upper electrode layer 4 only in one part, and performs the above-mentioned ferromagnetic resonance excitation by the electric field between the upper electrode layer 4 and the magnetic anisotropy control layer 1. As a result, ferromagnetic resonance is excited only in the area of the ultrathin ferromagnetic layer 2 directly below the upper electrode layer 4. This ferromagnetic resonance excitation propagates in the ultrathin ferromagnetic layer 2 as a spin wave, via exchange interaction, dipolar interaction, or the combination thereof. That is, the ultrathin ferromagnetic layer 2 continuous with the ferromagnetic resonance excitation part serves as a spin wave transmission path. Structures of various magnetic function elements described later can be realized based on this spin wave signal generation element.

Embodiment 4

Figure 10:
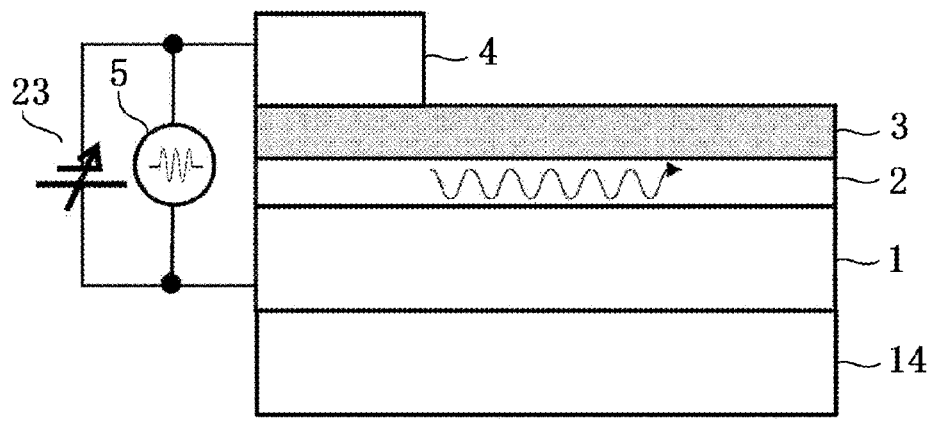
FIG. 10 is a diagram showing an example of a basic structure of a spin wave signal generation element in Embodiment 4.

FIG. 10 is a diagram showing a second example of a basic structure of a spin wave signal generation element using an electric field-driven type ferromagnetic resonance excitation method according to Embodiment 4 of the present invention. In addition to the basic structure in FIG. 9, the spin wave signal generation element includes the above-mentioned bias magnetic layer 14 and the dc voltage signal 23 is superimposed in addition to the high-frequency voltage signal 5 as in FIG. 8.

By controlling the leakage magnetic field strength from the bias magnetic layer 14 and the perpendicular magnetic anisotropy strength of the ultrathin ferromagnetic layer 2 by the application of the dc voltage signal 23, it is possible to arbitrarily control the equilibrium magnetization arrangement of the ultrathin ferromagnetic layer 2. The frequency, strength, propagation mode, and the like of the spin wave propagating in the ultrathin ferromagnetic layer 2 can be controlled in this way.

Embodiment 5

Figure 11:
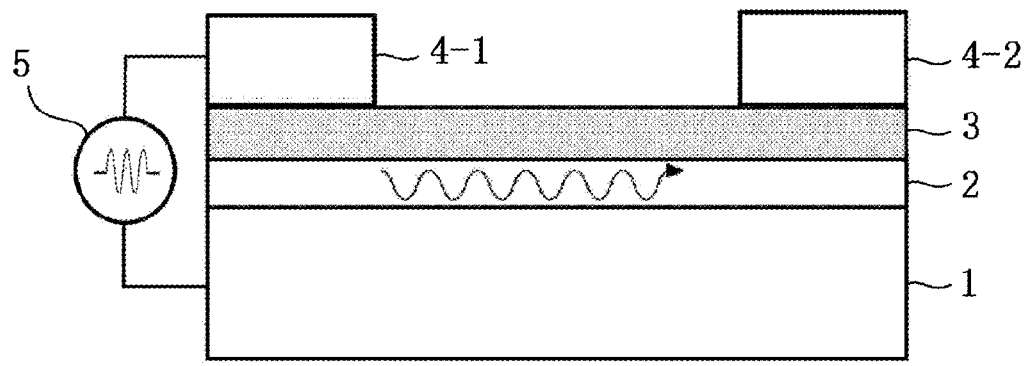
FIG. 11 is a diagram showing an example of a basic structure of a spin wave signal generation element in Embodiment 5.

FIG. 11 is a diagram showing an example of a basic structure of a spin wave signal generation element according to Embodiment 5 of the present invention. The spin wave signal generation element includes an upper electrode layer 4-1 as the input unit 4 in the spin wave signal generation element in FIG. 9, and the spin wave transmission path formed in the ultrathin ferromagnetic layer 2 and additionally includes at least one upper electrode layer 4-2 as a detection unit for detecting a spin wave signal generated in the input unit. Examples of the detection method include: a method of detecting an induced electromotive force generated by the spin wave; and a method using the spin rectification effect, or the magnetoresistive effect via the insulation barrier layer.

Though the detection unit is shown as a single layer in FIG. 11, the detection unit takes a form suitable for detection, such as a coplanar waveguide. The same material as the above-mentioned electrode layer formation material is applicable as the material for forming the upper electrode layers 4-1 and 4-2. Here, the electrode layers 4-1 and 4-2 do not necessarily need to be made of the same material, and may be designed according to use in such a manner that, for example, the upper electrode layer 4-1 is formed of a nonmagnetic metal material and the upper electrode layer 4-2 is formed of a ferromagnetic material.

Embodiment 6

Figure 12:
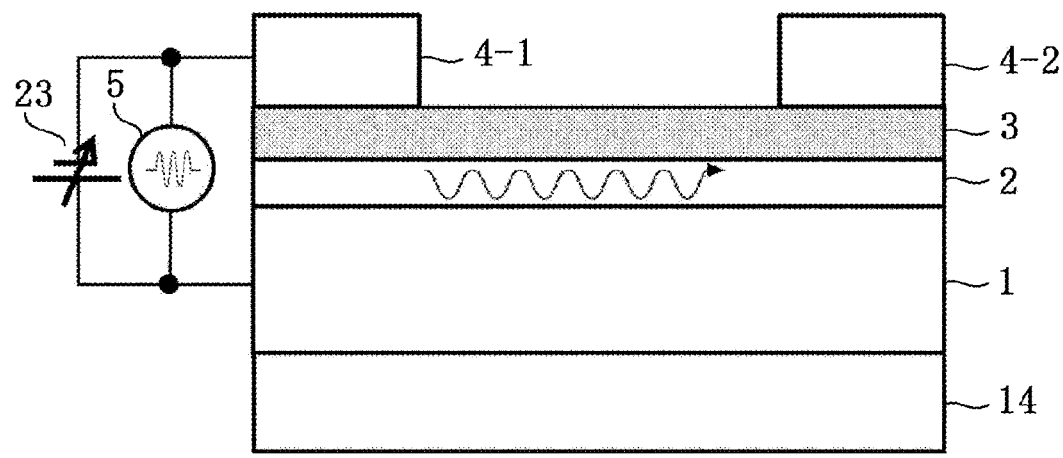
FIG. 12 is a diagram showing an example of a basic structure of a spin wave signal generation element in Embodiment 6.

FIG. 12 is a diagram showing an example of a basic structure of a spin wave signal generation element according to Embodiment 6 of the present invention. The spin wave signal generation element includes the upper electrode layer 4-1 as the input unit 4 in the spin wave signal generation element in FIG. 10, the spin wave transmission path formed in the ultrathin ferromagnetic layer 2, and the bias magnetic layer 14. The spin wave signal generation element additionally includes at least one upper electrode layer 4-2 as a detection unit for detecting a spin wave signal generated in the input unit. As in the structure in FIG. 10, the dc voltage signal 23 is superimposed in addition to the high-frequency voltage signal 5. By controlling the leakage magnetic field strength from the bias magnetic layer 14 and the perpendicular magnetic anisotropy strength of the ultrathin ferromagnetic layer 2 by the dc voltage application, it is possible to arbitrarily control the equilibrium magnetization configuration of the ultrathin ferromagnetic layer 2. The frequency, strength, propagation mode, and the like of the spin wave propagating in the ultrathin ferromagnetic layer 2 can be controlled in this way. The structure of the detection unit is the same as that in FIG. 11.

Embodiment 7

Figure 13:
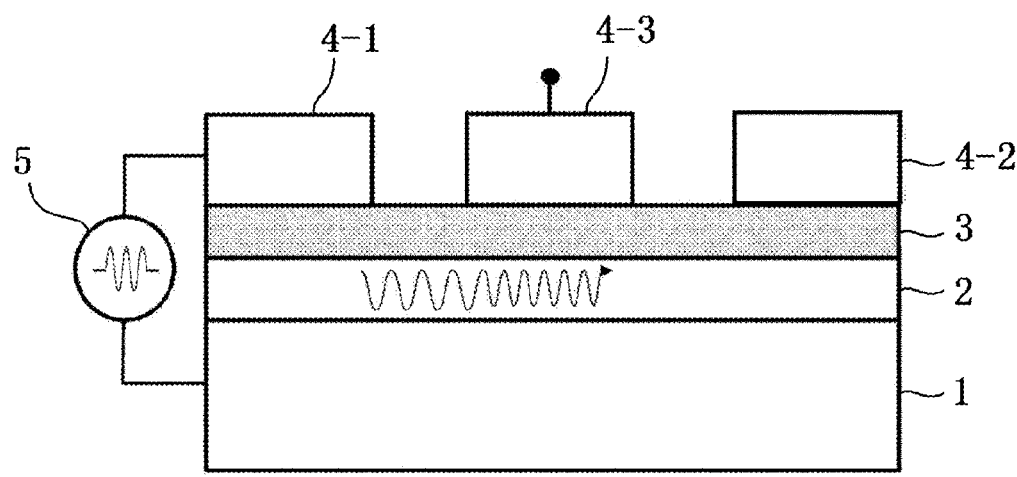
FIG. 13 is a diagram showing an example of a basic structure of a function element using a spin wave signal element in Embodiment 7.

FIG. 13 is a diagram showing an example of a basic structure of a function element using a spin wave signal generation element according to Embodiment 7 of the present invention. The function element includes an upper electrode layer 4-3 for a gate control unit in one part on the spin wave transmission path between the input unit and the detection unit, in addition to the spin wave signal generation element in FIG. 11.

The same material as the upper electrode 4-2 is applicable as the material used in the upper electrode layer 4-3 for the gate control unit. A dc or ac voltage signal is supplied to the upper electrode layer 4-3 of the gate control unit, to locally control the magnetic anisotropy of the part of the ultrathin ferromagnetic layer 2 forming the spin wave transmission path directly below the upper electrode layer 4-3. The wave nature of the transmitted spin wave, such as frequency, wavelength, amplitude, and phase, can thus be changed. This enables the transmitted spin wave detected in the upper electrode layer 4-2 as the detection unit, to be converted to a spin wave that differs in wave nature from the spin wave generated in the upper electrode 4-1 as the input unit.

Embodiment 8

Figure 14:
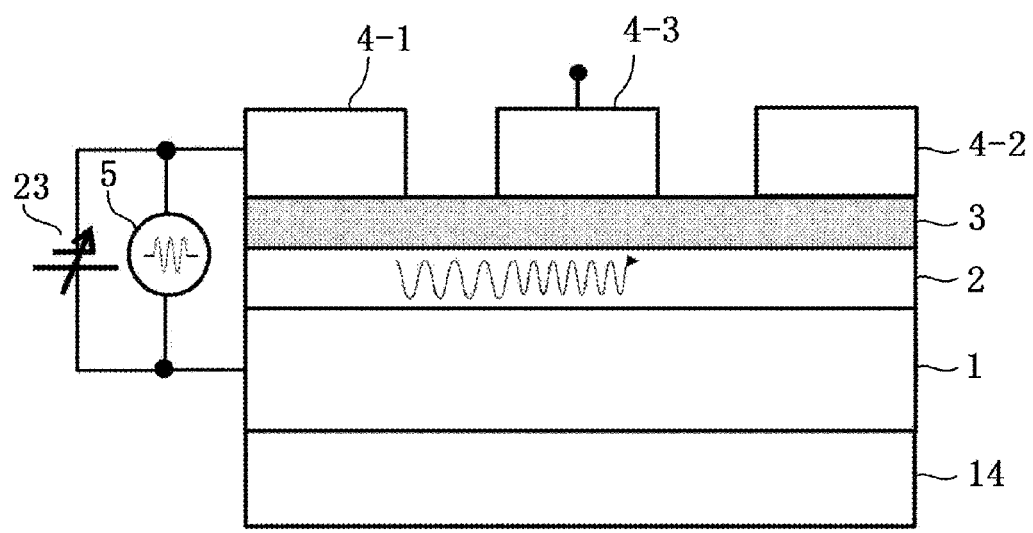
FIG. 14 is a diagram showing an example of a basic structure of a function element using a spin wave signal element in Embodiment 8.

FIG. 14 is a diagram showing an example of a basic structure of a function element using a spin wave signal generation element according to Embodiment 8 of the present invention. The function element includes the upper electrode layer 4-3 for the gate control unit in one part on the spin wave transmission path between the input unit and the detection unit, in addition to the spin wave signal generation element in FIG. 12.

The same material as in FIG. 13 is applicable as the material used in the upper electrode layer 4-3 as the gate control unit. The dc voltage signal 23 is superimposed in addition to the high-frequency voltage signal 5. By controlling the leakage magnetic field strength from the bias magnetic layer 14 and the perpendicular magnetic anisotropy strength of the ultrathin ferromagnetic layer 2 by the application of the dc voltage signal 23, it is possible to arbitrarily control the equilibrium magnetization configuration of the ultrathin ferromagnetic layer 2. The frequency, strength, propagation mode, and the like of the input spin wave signal propagating in the ultrathin ferromagnetic layer can be controlled in this way. Further, a dc or ac voltage signal is supplied to the upper electrode layer 4-3 of the gate control unit, to control the magnetic anisotropy of the part of the ultrathin ferromagnetic layer forming the spin wave transmission path directly below the gate control unit. The wave nature of the spin wave generated in the upper electrode 4-1 as the input unit, such as frequency, wavelength, amplitude, and phase, can thus be changed. This enables the transmitted spin wave detected in the detection unit to be converted to a spin wave that differs in wave nature from the spin wave generated in the upper electrode 4-1 as the input unit.

Embodiment 9

Figure 15A:
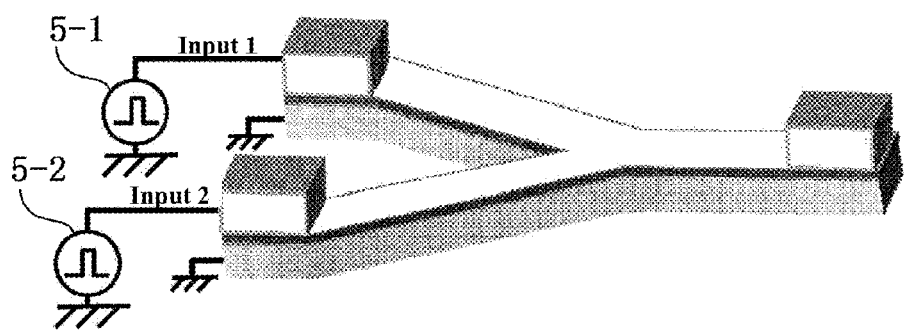
FIG. 15($a$) is a diagram showing an example of a basic structure of a function element using a spin wave signal generation element, FIG. 15($b$) is a conceptual diagram of an OR logic circuit using a spin wave signal, and FIG. 15($c$) is a conceptual diagram of an AND logic circuit using a spin wave signal in Embodiment 9.

FIG. 15(a) is a diagram showing a structure of a function element using a spin wave signal generation element according to Embodiment 9 of the present invention, namely, an example of a structure of an OR logic circuit.

Figure 15B:
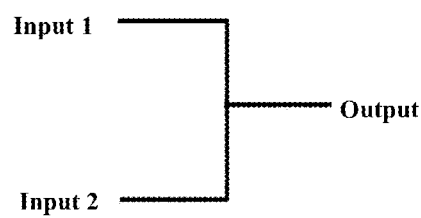
Figure 15C:
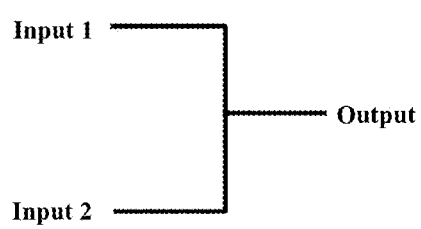

High-frequency voltage signals 5-1 and 5-2 are input to two electric field spin wave signal generation elements respectively from inputs 1 and 2 by a switching element or a trigger signal, each as a basic signal. The case where a spin wave is detected in the detection unit is defined as 1, and the case where no spin wave is detected in the detection unit is defined as 0. An example where the sign of the dc voltage pulse which is more controllable in practice is used as the input, and the negative voltage pulse is set to 1 and the positive voltage pulse to 0 is shown here. By optimally designing the perpendicular magnetic anisotropy change by the electric field, it is possible to generate a strong spin wave only in the case of the negative voltage pulse. This enables the OR operation shown in the truth table in FIG. 15(*b*). On the other hand, setting the spin wave detection strength in the detection unit higher than that in the OR circuit and detecting only the superimposed signal of the waves of the inputs 1 and 2 in the same circuit enables the AND operation shown in the truth table in FIG. 15(*c*). Different logic operation structures can be realized by the same circuit, using the spin wave nature in this way.

Embodiment 10

Figure 16A:
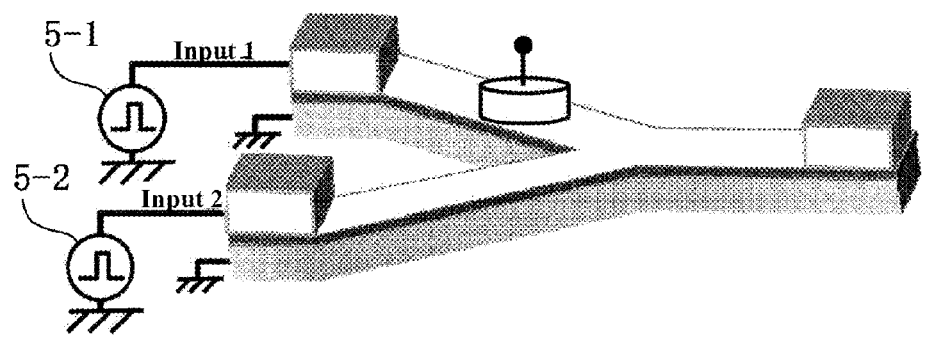
FIG. 16($a$) is a diagram showing an example of a basic structure of a function element using a spin wave signal generation element.
FIG. 16(b) is a conceptual diagram of an XOR logic circuit using a spin wave signal generation element in Embodiment 10.
Figure 16B:
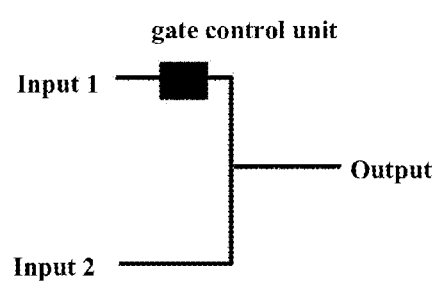

FIG. 16(*a*) is a diagram showing a structure of a function element using a spin wave signal generation element according to Embodiment 10 of the present invention, namely, an example of a structure of an XOR logic circuit (exclusive OR circuit).

The function element has roughly the same structure as the OR circuit in FIG. 15(*a*), but includes a gate control unit on the spin wave transmission path on the input 1 side (or the input 2 side) and has a function of converting the phase of the propagation spin wave generated on the input 1 side by 180 degrees. Suppose the sign of the input dc voltage pulse is used as the input, and the negative voltage pulse is set to 1 and the positive voltage pulse to 0. A spin wave is generated in input 1, whereas no spin wave is generated in input 0. The case where a spin wave is detected in the detection unit is defined as 1, and the case where no spin wave is detected in the detection unit is defined as 0. In the case where only one of the inputs is 1, a spin wave is detected in the detection unit, so that the output is 1. In the case where both inputs are 0, no spin wave is detected, so that the output is 0. In the case where both inputs are 1, a spin wave is generated from each input. However, since the phase is changed by 180 degrees on the input 1 side, the combined spin waves are lost and no spin wave is detected in the detection unit. This enables the XOR operation shown in the truth table in FIG. 16(*b*).

Embodiment 11

Figure 17A:
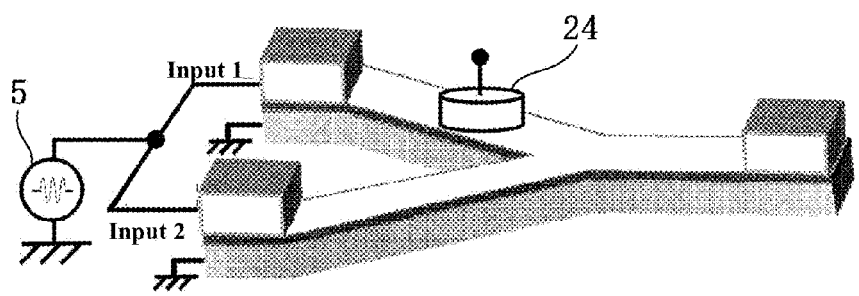
FIG. 17(a) is a diagram showing an example of a basic structure of a function element using a spin wave signal generation element.
Figure 17B:
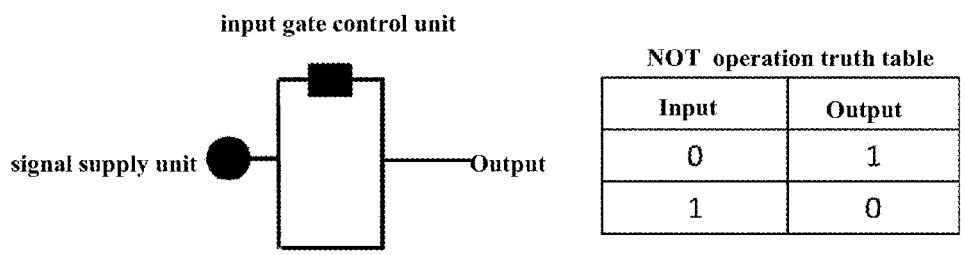
FIG. 17(b) is a conceptual diagram of a NOT logic circuit using a spin wave signal generation element in Embodiment 11.

FIG. 17(*a*) is a diagram showing a structure of a function element using a spin wave signal generation element according to Embodiment 11 of the present invention, namely, an example of a structure of a NOT logic circuit. Though the function element is similar in structure to the XOR circuit shown in FIG. 16(*a*), a common high-frequency electric field signal supply unit is provided for two spin wave signal generation elements, and a basic signal is supplied to each spin wave transmission path. In this case, the input voltage signal may be any of a pulsed high-frequency signal and a dc pulse voltage signal. A gate control unit 24 is provided to control the phase of the spin wave signal generated in the input 2 by 180 degrees. The case where there is an input in this part is defined as 1, and the case where there is no input in this part is defined as an input value. The presence or absence of a spin wave signal in the detection unit is output. Here, the case where a spin wave signal is detected is defined as 1, and the case where no spin wave signal is detected is defined as 0. In the case where the input of the gate control unit 24 is 0, the generated spin wave is directly combined and detected, so that the output is 1. In the case where the input of the gate control unit is 1, on the other hand, the phase of the signal of the input 2 is converted by 180 degrees in the gate control unit, so that the combined spin waves cancel out each other and the output is 0. This enables the NOT operation shown in the truth table in FIG. 17(*b*).

Embodiment 12

Figure 18:
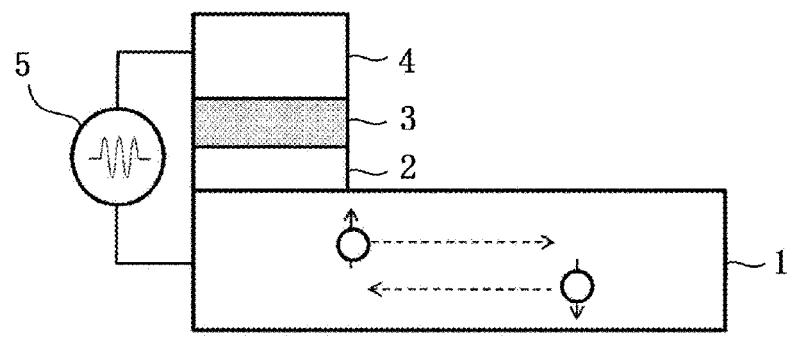
FIG. 18 is a diagram showing an example of a basic structure of a spin current signal generation element in Embodiment 12.

FIG. 18 is a diagram showing a basic structure of a spin current signal generation element using an electric field-driven type ferromagnetic resonance excitation method according to Embodiment 12 of the present invention. The spin current signal generation element includes the laminate structure of the upper electrode layer 4, the insulation barrier layer 3, and the ultrathin ferromagnetic layer 2 only in one part, and performs the above-mentioned ferromagnetic resonance excitation by the electric field between the upper electrode layer 4 and the magnetic anisotropy control layer 1. As a result, ferromagnetic resonance is excited in the ultrathin ferromagnetic layer 2 directly below the upper electrode layer 4, thus diffusively generating a pure spin current in the magnetic anisotropy control layer 1. The magnetic anisotropy control layer 1 continuous rightward from below the above-mentioned laminate structure serves as a spin current transmission path. Structures of various magnetic function elements described later can be realized based on this spin current signal generation element.

Embodiment 13

Figure 19:
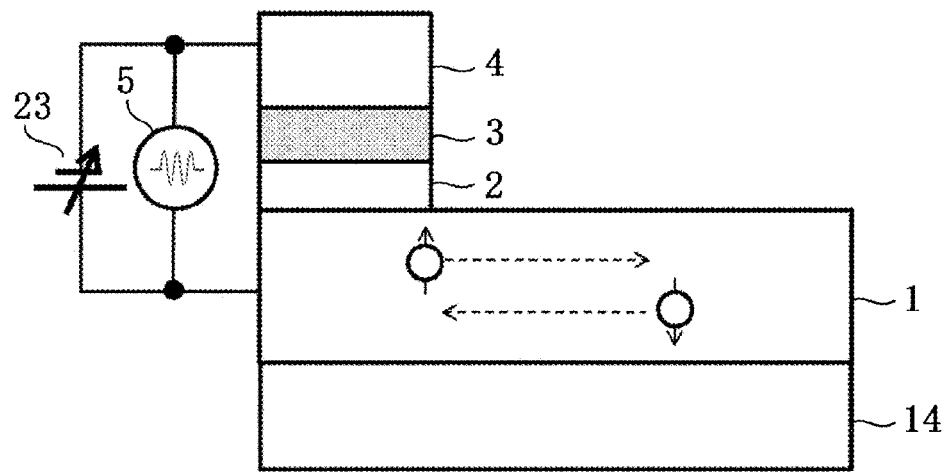
FIG. 19 is a diagram showing an example of a basic structure of a spin current signal generation element in Embodiment 13.

FIG. 19 is a diagram showing a basic structure of a spin current signal generation element using an electric field-driven type ferromagnetic resonance excitation method according to Embodiment 13 of the present invention. In addition to the basic structure in FIG. 18 the spin current signal generation element includes the bias magnetic layer 14, and the dc voltage signal 23 is superimposed in addition to the high-frequency voltage signal 5. By controlling the leakage magnetic field strength from the bias magnetic layer 14 and the perpendicular magnetic anisotropy strength of the ultrathin ferromagnetic layer 2 by the application of the dc voltage signal 23, it is possible to arbitrarily control the equilibrium magnetization configuration of the ultrathin ferromagnetic layer 2. The strength and the like of the spin current propagating in the magnetic anisotropy control layer 1 can be controlled in this way.

Embodiment 14

Figure 20:
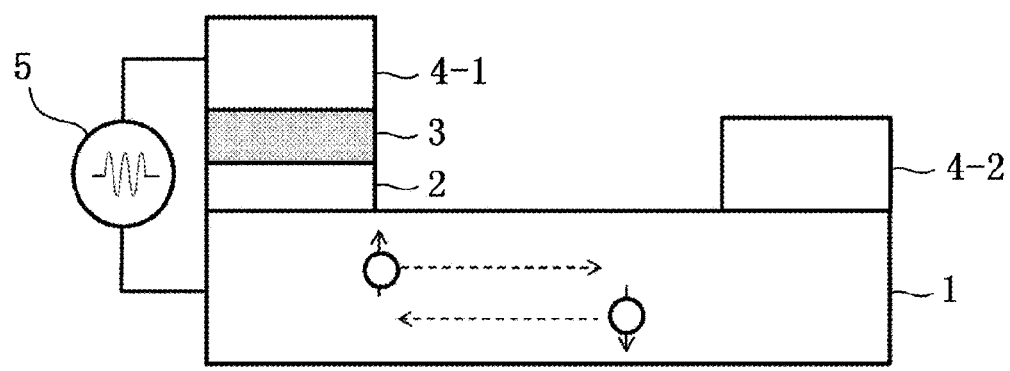
FIG. 20 is a diagram showing an example of a basic structure of a spin current signal generation element in Embodiment 14.

FIG. 20 is a diagram showing an example of a basic structure of a spin current generation element according to Embodiment 14 of the present invention. The spin current signal generation element includes an upper electrode layer 4-1 as the input unit in the spin current signal generation element in FIG. 18 and the spin current transmission path formed in the magnetic anisotropy control layer 1, and additionally includes at least one upper electrode layer 4-2 as a detection unit for detecting a spin current signal generated in the input unit. Examples of the detection method include the inverse spin Hall effect and the like. Examples of the material used in the upper electrode layer 4-2 include Au, Pt, Pd, Ag, Bi, and an alloy including at least one of them, to attain a high detection signal strength.

Embodiment 15

Figure 21:
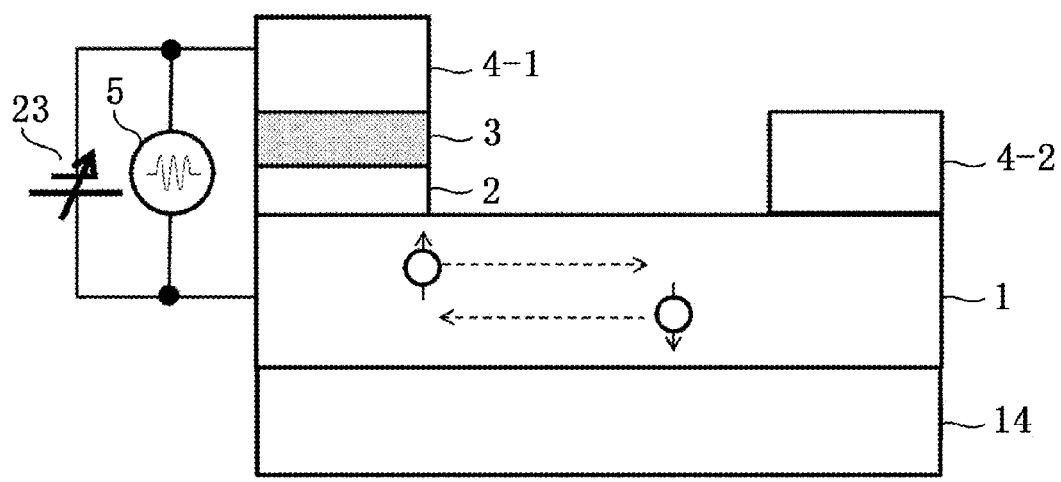
FIG. 21 is a diagram showing an example of a basic structure of a spin current signal generation element in Embodiment 15.

FIG. 21 is a diagram showing a second example of a basic structure of a spin current generation element according to Embodiment 15 of the present invention. The spin current signal generation element includes the bias magnetic layer 14 in addition to the structure in FIG. 20. By controlling the leakage magnetic field strength from the bias magnetic layer 14 and the perpendicular magnetic anisotropy strength of the ultrathin ferromagnetic layer 2 by the dc voltage application, it is possible to arbitrarily control the equilibrium magnetization configuration of the ultrathin ferromagnetic layer 2. The strength and the like of the spin current propagating in the spin current transmission path can be controlled in this way. The structure of the detection unit is the same as that in FIG. 20.

Embodiment 16

Figure 22:
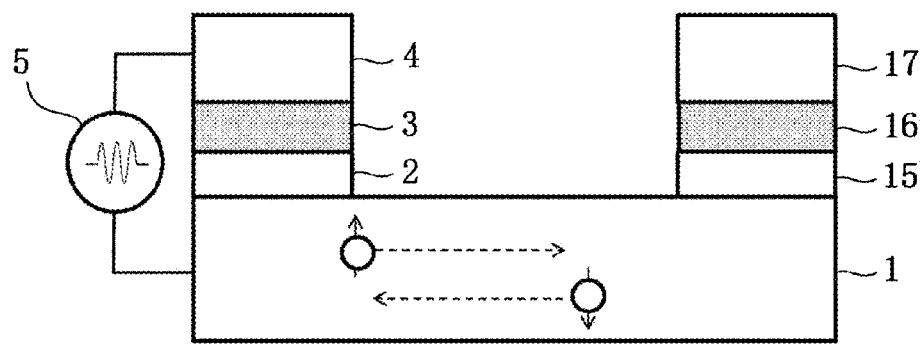
FIG. 22 is a diagram showing an example of a basic structure of a spin current signal generation element in Embodiment 16.

FIG. 22 is a diagram showing an example of a basic structure of a spin current generation element according to Embodiment 16 of the present invention. The structures of the input unit and the spin current transmission path are the same as those in the spin current signal generation element in FIG. 20, but the detection unit has a junction structure composed of a ferromagnetic layer 15, a nonmagnetic spacer layer 16, and a ferromagnetic layer 17 so as to be in contact on the magnetic anisotropy control layer 1 which is the spin current transmission path.

The spin current generated by the voltage signal supplied to the input unit propagates through the spin current transmission path and is absorbed into the ferromagnetic layer 17. Through the use of the spin angular momentum transfer effect by this spin current absorption, the magnetization direction of the ferromagnetic layer 17 can be controlled according to the magnetization direction of the ultrathin ferromagnetic layer 2. Hence, this structure can also be used as a basic structure of a magnetic storage element.

The magnetization direction of the ferromagnetic layer 17 can be detected by the magnetoresistive effect that reflects the relative magnetization angle with the ferromagnetic layer 17 via the nonmagnetic spacer layer 16. For the ferromagnetic layers 15 and 17, the same material as the ultrathin ferromagnetic layer 2 may be used as a specific example. For the nonmagnetic spacer layer 16, specific examples of the material include Au, Ag, Cu, Al, and an alloy including at least one of these elements, in the case where the detection signal is the giant magnetoresistive effect. In the case where the detection signal is the tunnel magnetoresistive effect, on the other hand, the same material as the insulation barrier layer 3 may be used. The magnetization direction of the ultrathin ferromagnetic layer 2 on the input unit side can be controlled by the input voltage signal.

Embodiment 17

Figure 23A:
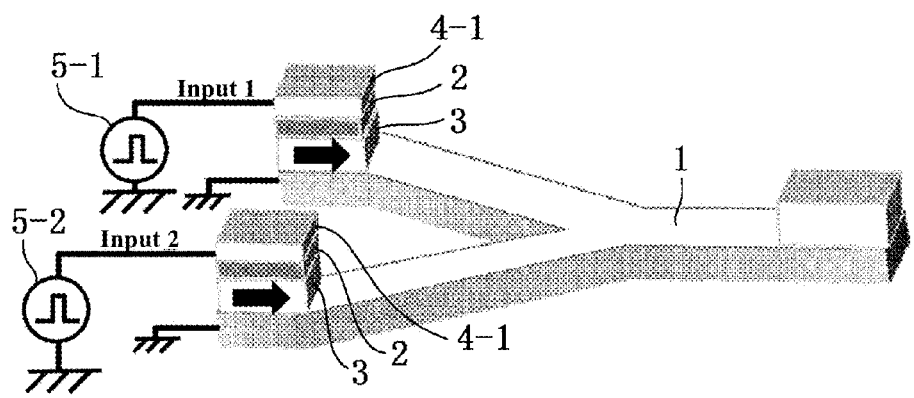
FIG. 23(a) is a diagram showing an example of a basic structure of a function element using a spin current signal generation element in Embodiment 17.

FIG. 23(a) is a diagram showing an example of a structure of a function element using a spin current signal generation element according to Embodiment 17 of the present invention. The function element includes two terminals (inputs 1 and 2) that are each the input unit in the spin current generation element shown in FIG. 20. The magnetization direction of the ultrathin ferromagnetic layer 2 is set to the same direction such as rightward, and the high-frequency voltage signals 5-1 and 5-2 are separately input. An example where the sign of the dc voltage pulse which is highly controllable in practice is used as the input, and the negative voltage pulse is set to 1 and the positive voltage pulse to 0 is shown here. By optimally designing the perpendicular magnetic anisotropy change by the electric field, it is possible to excite strong ferromagnetic resonance only in the case of the negative voltage pulse, so that a spin current can be generated. The detection unit detects the composite signal of the spin currents transmitted from the inputs 1 and 2, via the magnetic anisotropy control layer 1 connected in the shape of Y. The case where no spin current is detected is defined as 0, and the case where a spin current is detected is defined as 1. This enables the OR operation satisfying the truth table shown in FIG. 15(b). On the other hand, setting the sensitivity of the detection unit so that only the condition of both inputs being 1, i.e. the spin currents being combined to be twice in strength, is detected enables the AND operation satisfying the truth table shown in FIG. 15(c) by the same element.

Embodiment 18

Figure 23B:
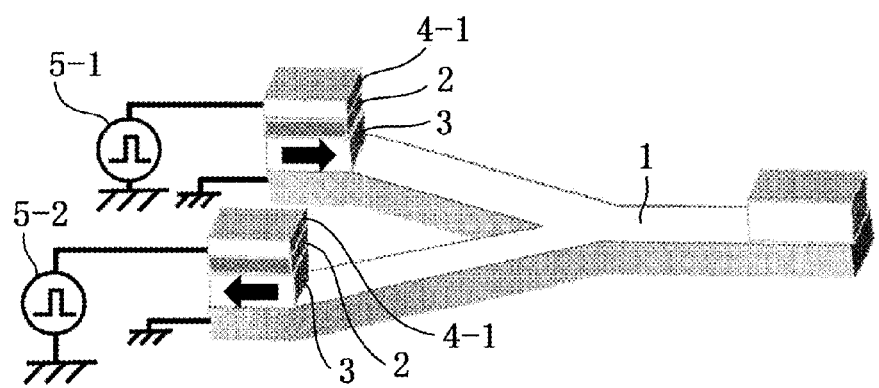
FIG. 23(b) is a diagram showing an example of a basic structure of a function element using a spin current signal generation element in Embodiment 18.

FIG. 23(b) is a diagram showing an example of a structure of a function element using a spin current signal generation element according to Embodiment 18 of the present invention. Though the structure is the same as that in FIG. 23(a), the magnetization directions of the inputs 1 and 2 are antiparallel.

When performing logic computation by the same operation as in FIG. 23(a), in the case where the combination of (input 1, input 2) is (0, 0), (0, 1), or (1, 0), the output is the same as that in FIG. 23(a). In the case of the input (1, 1), the spin currents generated from the antiparallel state are combined and as a result cancel out each other, so that the output is 0. This enables the XOR operation satisfying the truth table shown in FIG. 16(b), by this element. Thus, the element can be rewritten to a different arithmetic element by controlling the relative magnetization configuration of the inputs 1 and 2. Though the above describes an example where magnetization is in the in-plane direction, an arbitrary magnetization direction can be selected according to use.

Since the state of the input unit has nonvolatility using the magnetization direction, no standby power is needed. Moreover, in rewriting the input unit, magnetization reversal can be controlled by input of a larger voltage signal. A reconfigurable logic element driven by low power can therefore be provided.

Embodiment 19

Figure 24:
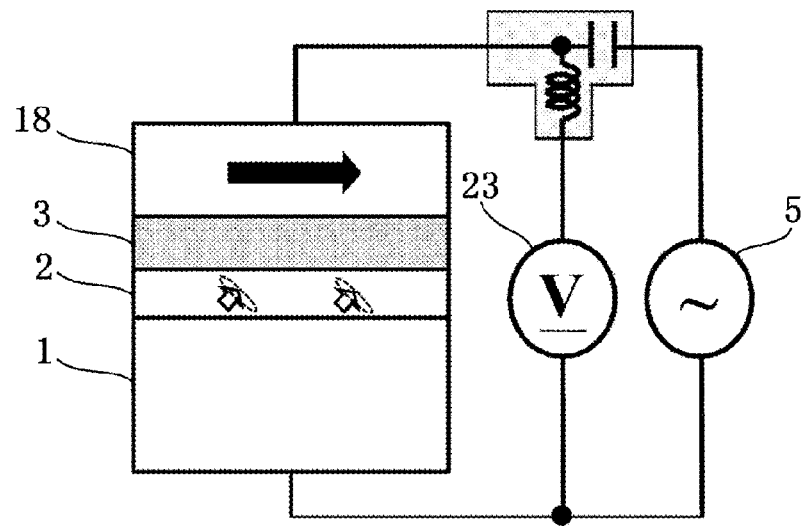
FIG. 24 is a diagram showing an example of a basic structure of a high-frequency detection element in Embodiment 19.

FIG. 24 is a schematic diagram of a structure and a circuit of a high-frequency detection element according to Embodiment 19 of the present invention. The high-frequency detection element has roughly the same structure as that in FIG. 1, but differs in that the electrode layer is composed of a ferromagnetic layer 18. The high-frequency voltage signal 5 whose frequency matches the resonance frequency of the ultrathin ferromagnetic layer 1 is applied between the magnetic anisotropy control layer 1 and the ferromagnetic layer 18, to supply the electric field signal generated as a result. This excites ferromagnetic resonance around the arbitrary magnetic field applied from outside. Specific examples of the materials applicable to the magnetic anisotropy control layer 1, the ultrathin ferromagnetic layer 2, and the insulation barrier layer 3 are the same as those described with reference to FIG. 1. Meanwhile, the same material as the ultrathin ferromagnetic layer 2 is applicable to the ferromagnetic layer 18. As described in the foregoing embodiments, the ferromagnetic resonance motion of the magnetization of the ultrathin ferromagnetic layer 2 induced by the high-frequency electric field generated by the high-frequency voltage signal 5 (frequency ω) creates the time oscillation (frequency ω) of the tunnel resistance. The component of the dc voltage and the high-frequency voltage (frequency 2ω) is generated at the element ends, by the product of the resistance oscillation and the high-frequency current flowing in a small amount in the element. A high-frequency detection element can be provided through detection of this dc voltage. A detection element obtained by combining the tunnel magnetoresistive effect and the ferromagnetic resonance excitation using the spin angular momentum transfer effect by the high-frequency current has been proposed with a similar structure and circuit (Non-Patent Document 5). However, current-based control has a problem of low efficiency and high power consumption, as described in the Background Art section. The present invention provides a high-frequency detection element of high sensitivity with ultimately almost no power consumption, by using a ferromagnetic tunnel junction element having the following structural features.

In detail, the characteristics required of the ultrathin ferromagnetic layer 2 are the same as those described with reference to FIG. 7. The materials and film thicknesses of the magnetic anisotropy control layer 1, the insulation barrier layer 3, and the ultrathin ferromagnetic layer 2 are controlled so that the effective diamagnetic field in the direction perpendicular to the film plane is less than or equal to 1000 (Oe). The characteristics of the insulation barrier layer 3 as the tunnel barrier are also the same as those described with reference to FIG. 1. That is, the insulation barrier layer 3 is designed so that the sheet resistance is greater than or equal to $10\ \Omega\mu m^2$ and the current density flowing in the element is less than or equal to $1\times10^9\ A/m^2$.

Embodiment 20

Figure 25:
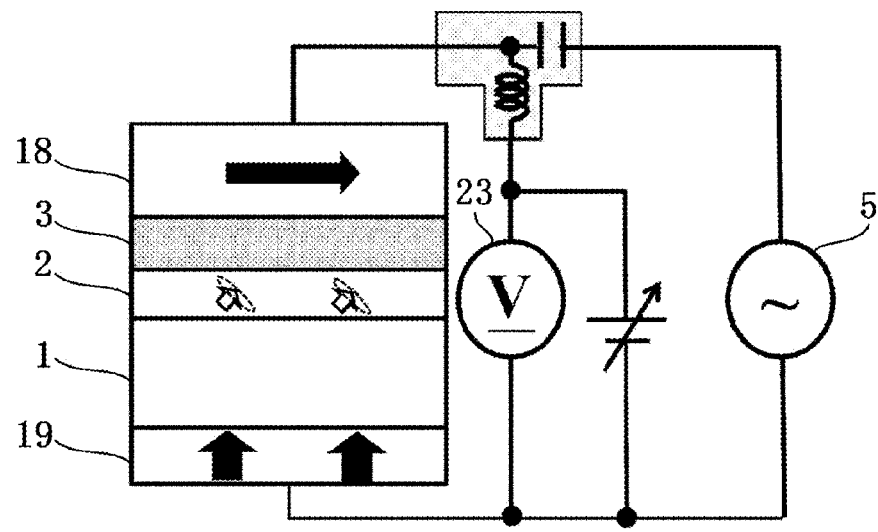
FIG. 25 is a diagram showing an example of a basic structure of a high-frequency detection element in Embodiment 20.

FIG. 25 is a schematic diagram of a structure and a circuit of a high-frequency detection element according to Embodiment 20 of the present invention. The high-frequency detection element includes a bias magnetic layer 19 in addition to the structure and the circuit shown in FIG. 24, and the dc voltage signal 23 is applied in addition to the high-frequency voltage signal 5. The same materials as those in FIG. 24 are applicable as the materials used in the respective layers. By combined control of the leakage magnetic field from the bias magnetic layer 19 and the magnetic anisotropy of the ultrathin ferromagnetic layer 2 by the application of the dc voltage signal 5, it is possible to arbitrarily control the equilibrium magnetization direction of the ultrathin ferromagnetic layer 2. As a result, the resonance excitation condition can be arbitrarily controlled without applying the magnetic field from outside. This also means that the detection frequency can be voltage-controlled. An ultralow-power high-frequency detection element driven by an electric field alone and variable in frequency can therefore be provided.

Figure 26:
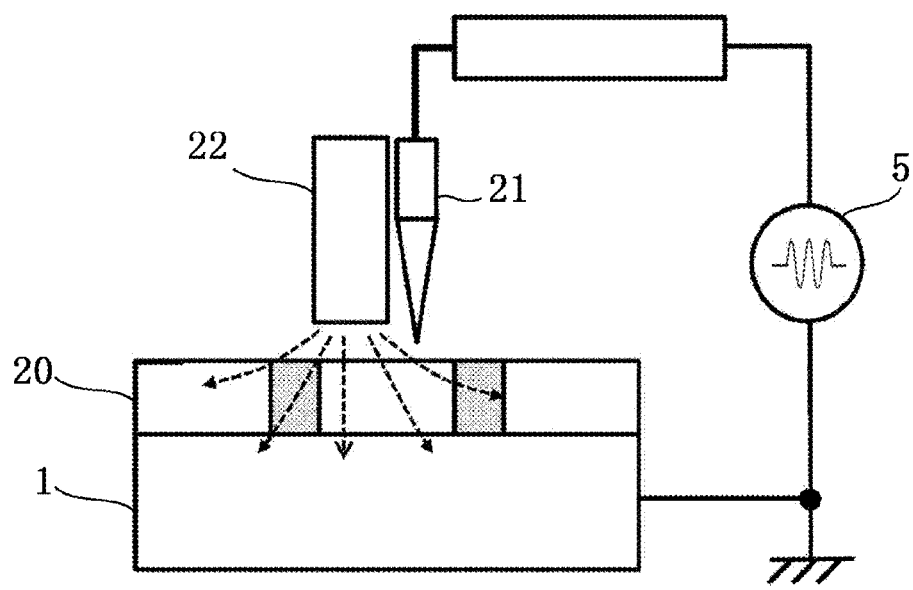
FIG. 26 is a conceptual diagram of a magnetic recording device in Embodiment 21.

FIG. 26 is a schematic diagram of a magnetic recording device according to Embodiment 21 of the present invention. Here, a perpendicularly magnetized magnetic medium 20 has a form of isolated microparticles where the ultrathin ferromagnetic layer is separated by an insulation layer. One recording bit is formed by one particle or a group of a plurality of particles. A high-frequency electric field matching the resonance frequency of the ultrathin ferromagnetic layer or a dc pulse electric field whose pulse width is about the inverse of the resonance frequency is applied to this structure using a high-frequency electric field assist head 21, where the tip of the high-frequency electric field assist head 21 is the electrode layer and the gap with the perpendicularly magnetized magnetic medium 20 is the insulation barrier layer. By doing so, ferromagnetic resonance is locally excited in the ultrathin ferromagnetic layer of the perpendicularly magnetized magnetic medium 20, and at the same time magnetization reversal control is performed by a dc magnetic field applied from a write magnetic field head. Ferromagnetic resonance excitation causes an apparent reduction of the energy barrier necessary for magnetization reversal of the ultrathin ferromagnetic layer. A magnetic recording system in which the magnetization reversal magnetic field by magnetic field application from a write magnetic head 22 employed in a typical hard disk is reduced can be realized in this way. As a desirable form, the input to the high-frequency electric field assist head 21 is continuously performed and, in a state where electric field-induced ferromagnetic resonance is excited for a plurality of bits, a dc magnetic field is applied more locally to only the bits that need to be written, thereby performing magnetization reversal control. This allows the tip diameter of the high-frequency electric field assist head 21 to be designed sufficiently larger (e.g. about several hundred nm) than a 1-bit recording area. The optimal values of the application strength and angle of the dc magnetic field are determined by the magnetic anisotropy change of the ultrathin ferromagnetic layer induced by electric field application.

To control the electric field applied to the ultrathin magnetic layer of the perpendicularly magnetized magnetic medium 20 to 1 V/nm or less, the gap between the high-frequency electric field assist head 21 and the perpendicularly magnetized magnetic medium 20 is desirably designed to 3 nm or less. As the material for the ultrathin ferromagnetic layer 20 of the perpendicularly magnetized magnetic medium 20, a material (e.g. CoCrPt) formed from an alloy whose main component is Co, which has already been applied, is preferable, though a wide variety of materials such as Fe, Co, or Ni, an alloy layer including at least one of these elements, a layer made of a compound, an alloy, or the like including a rare-earth element such as Nd, Sm, or Tb, an oxide (e.g. ferrite, garnet), or a laminate structure including the above-mentioned materials are available.

The power consumed by the high-frequency electric field assist head 21 is very low, i.e. less than or equal to $\frac{1}{1000}$ of the current-controlled type. Considerable power saving equivalent to the reduction of the magnetization reversal magnetic field by resonance excitation is expected as compared with the conventional magnetization reversal control using only a dc current magnetic field and high-frequency assist magnetization reversal control using high-frequency spin torque oscillation. If the effective reversal magnetic field can be reduced by the high-frequency electric field assist head 21, the magnetic anisotropy in the state where no electric field is applied, i.e. in the record retention state, can be designed high. This contributes to a smaller size per bit and so a larger recording medium capacity.

The magnetic function element based on ferromagnetic resonance excitation by an electric field according to the present invention enables provision of a logic operation element, a magnetic storage element, a high-frequency detection element, and a magnetic recording system of low power consumption that use only an electric field as drive power.

Though the embodiments of the present invention have been described above, the present invention is not limited to the above description. Any design change appropriately made by a person skilled in the art to the foregoing embodiments is also included in the scope of the present invention as long as it contains the features of the present invention.

Moreover, the components in the foregoing embodiments may be combined as long as it is technically possible, and such combination is also included in the scope of the present invention as long as it contains the features of the present invention.

INDUSTRIAL APPLICABILITY

According to the present invention, ferromagnetic resonance dynamics can be efficiently excited merely by, applying a magnetic field having a specific magnetic field application angle and magnetic field strength to a laminate structure in which an ultrathin ferromagnetic layer sufficiently thin so that an electric field shield effect by conduction electrons does not occur and a magnetic anisotropy control layer are directly stacked on each other and an insulation barrier layer and an electrode layer are arranged in order on an ultrathin ferromagnetic layer side, and further applying an electric field having a high-frequency component of a magnetic resonance frequency between the magnetic anisotropy control layer and the electrode layer.

This achieves room-temperature operation, high repeated operation tolerance, and a simple production process to reduce the manufacturing cost.

Besides, since electric field application is used, ferromagnetic resonance can be excited with very low power. The present invention is therefore expected to be used as magnetic function elements such as a high-frequency detection element, a magnetic recording device, and a logic element in which a spin wave signal generation element or a spin current signal generation element for performing ferromagnetic resonance excitation based on electric field drive is used for signal input and control.

REFERENCE SIGNS LIST 1 magnetic anisotropy control layer
2 ultrathin ferromagnetic layer
3 insulation barrier layer
4 upper electrode layer
5 high-frequency voltage signal
6 buffer layer
7 Au magnetic anisotropy control layer
8 ultrathin FeCo layer
9 MgO insulation barrier layer
10 upper Fe layer
11 cap layer
12 signal generator
13 voltmeter
14, 19 bias magnetic layer
15, 17, 18 ferromagnetic layer
20 perpendicularly magnetized medium
21 high-frequency electric field assist head
22 write magnetic head

The invention claimed is:
1. An electric field-driven type ferromagnetic resonance excitation method, comprising:

applying a magnetic field having a specific magnetic field application angle and magnetic field strength to a laminate structure in which an ultrathin ferromagnetic layer sufficiently thin so that an electric field shield effect by conduction electrons does not occur and a magnetic anisotropy control layer are directly stacked on each other and an insulation barrier layer and an electrode layer are arranged in order on the ultrathin ferromagnetic layer side, wherein a resistance-area value of the insulation barrier layer is greater than or equal to 10 $\Omega\mu m^2$, and a tunnel current density flowing via the insulation barrier layer during voltage application is less than or equal to $1 \times 10^9$ A/m$^2$, and applying an electric field having a high-frequency component of a magnetic resonance frequency between the magnetic anisotropy control layer and the electrode layer, thereby exciting ferromagnetic resonance in the ultrathin ferromagnetic layer.

2. The electric field-driven type ferromagnetic resonance excitation method according to claim 1, wherein a film thickness of the ultrathin ferromagnetic layer is set to be sufficiently small thickness so that the electric field shield effect by the conduction electrons does not occur, according to a material and the film thickness of the ultrathin ferromagnetic layer, a material of the magnetic anisotropy control layer, and a material and a film thickness of the insulation barrier layer.

3. The electric field-driven type ferromagnetic resonance excitation method according to claim 2, wherein the film thickness of the ultrathin ferromagnetic layer is determined so that a maximum perpendicular magnetic anisotropy magnetic field change amount induced by applying the electric field having the high-frequency component is greater than or equal to 5% of perpendicular magnetic anisotropy of the ultrathin ferromagnetic layer, the perpendicular magnetic anisotropy being determined by a combination of the magnetic anisotropy control layer, the insulation barrier layer, and the ultrathin ferromagnetic layer.

4. The electric field-driven type ferromagnetic resonance excitation method according to claim 1, wherein an effective diamagnetic field in a direction perpendicular to a film plane of the ultrathin ferromagnetic layer is less than or equal to 1000 (Oe), by selecting interface magnetic anisotropy or crystal magnetic anisotropy of the magnetic anisotropy control layer and the insulation barrier layer.

5. The electric field-driven type ferromagnetic resonance excitation method according to claim 1, wherein Au, Ag, Cu, Al, Ta, Ru, Cr, Pt, Pd, or an alloy thereof is used as the magnetic anisotropy control layer.

6. The electric field-driven type ferromagnetic resonance excitation method according to claim 1, wherein a bias magnetic layer for applying a bias magnetic field is provided in the laminate structure on a side opposite to the electrode layer, and a dc electric field and the electric field having the high-frequency component of the magnetic resonance frequency are superimposedly applied between the electrode layer and the bias magnetic layer, thereby exciting ferromagnetic resonance around an arbitrary equilibrium magnetization direction.

7. A spin wave signal generation element comprising:
a laminate structure in which an ultrathin ferromagnetic layer sufficiently thin so that an electric field shield effect by conduction electrons does not occur and a magnetic anisotropy control layer are directly stacked on each other, and an insulation barrier layer and an electrode layer are arranged in sequence on the ultrathin ferromagnetic layer side, wherein a resistance-area value of the insulation barrier layer is greater than or equal to 10 $\Omega\mu m^2$, and a tunnel current density flowing via the insulation barrier layer during voltage application is less than or equal to $1\times10^9$ A/m²;

means for applying a magnetic field having a specific magnetic field application angle and magnetic field strength, to the laminate structure; and means for applying an electric field having a high-frequency component of a magnetic resonance frequency, between the magnetic anisotropy control layer and the electrode layer, wherein a spin wave locally generated by exciting ferromagnetic resonance in the ultrathin ferromagnetic layer is extracted from at least one spin wave guide formed continuously with the ultrathin ferromagnetic layer or the magnetic anisotropy control layer.

8. The spin wave signal generation element according to claim 7, further comprising a spin wave signal detection unit on the spin wave guide.

9. The spin wave generation element according to claim 8, wherein the spin wave signal detection unit is formed by a high-frequency signal transmission path provided on the ultrathin ferromagnetic layer via the insulation barrier layer, and detects a signal using an induced electromotive force generated by the spin wave.

10. The spin wave generation element according to claim 8, wherein the spin wave signal detection unit is formed by a laminate structure that is composed of the insulation barrier layer and a ferromagnetic layer which are formed on the ultrathin ferromagnetic layer, and uses a tunnel magnetoresistive effect via the insulation barrier layer in detecting a signal.

11. The spin wave signal generation element according to claim 7, wherein a bias ferromagnetic layer for applying a bias magnetic field is provided in the laminate structure on a side opposite to the electrode layer, and a dc electric field and the electric field having the high-frequency component of the magnetic resonance frequency are superimposedly applied between the electrode layer and the bias ferromagnetic layer, thereby exciting ferromagnetic resonance around an arbitrary equilibrium magnetization direction and arbitrarily control a frequency of the spin wave that propagates.

12. The spin wave signal generation element according to claim 7, wherein a laminate structure composed of the insulation barrier layer and the electrode layer is provided in a part of the spin wave guide, and a dc electric field and the electric field having the high-frequency component of the magnetic resonance frequency are applied to locally directly control magnetic anisotropy of the ultrathin ferromagnetic layer forming the spin wave guide, thereby changing wave nature of the spin wave propagating through the spin wave guide, the wave nature including any of a frequency, a wavelength, an amplitude, and a phase.

13. A spin wave logic element comprising a combination of a plurality of spin wave signal generation elements according to claim 7, wherein wave nature of a spin wave propagating through the spin wave guide is controlled by a signal input via each of the means for applying the electric field having the high-frequency component of the magnetic resonance frequency, thereby performing a logic operation.

14. A spin current signal generation element comprising:
a laminate structure in which an ultrathin ferromagnetic layer sufficiently thin so that an electric field shield effect by conduction electrons does not occur and a magnetic anisotropy control layer are directly stacked on each other, and an insulation barrier layer and an electrode layer are arranged in sequence on the ultrathin ferromagnetic layer side, wherein a resistance-area value of the insulation barrier layer is greater than or equal to 10 $\Omega\mu m^2$, and a tunnel current density flowing via the insulation barrier layer during voltage application is less than or equal to $1\times10^9$ A/m²;

means for applying a magnetic field having a specific magnetic field application angle and magnetic field strength, to the laminate structure; and means for applying an electric field having a high-frequency component of a magnetic resonance frequency, between the magnetic anisotropy control layer and the electrode layer, wherein a pure spin current locally generated by exciting ferromagnetic resonance in the ultrathin ferromagnetic layer is generated in the magnetic anisotropy control layer, and the magnetic anisotropy control layer serves as a spin current transmission path.

15. The spin current signal generation element according to claim 14, wherein a bias ferromagnetic layer for applying a bias magnetic field is provided in the laminate structure on a side opposite to the electrode layer, and a dc electric field and the electric field having the high-frequency component of the magnetic resonance frequency are superimposedly applied between the electrode layer and the bias ferromagnetic layer to excite ferromagnetic resonance around an arbitrary equilibrium magnetization direction and arbitrarily control a strength of the spin current that propagates.

16. The spin current signal generation element according to claim 14, wherein the magnetic anisotropy control layer is made of Au, Ag, Cu, Al, Ta, Ru, Cr, Pt, Pd, or an alloy including at least one of Au, Ag, Cu, Al, Ta, Ru, Cr, Pt, and Pd.

17. The spin current signal generation element according to claim 14, further comprising a spin current detection unit, wherein the spin current is a transmission signal, the magnetic anisotropy control layer is the spin current transmission path, and an inverse spin Hall effect is used in the magnetic anisotropy control layer.

18. The spin current signal generation element according to claim 17, further comprising a tunnel magnetoresistive element as the spin current detection unit, wherein the spin current is the transmission signal and the tunnel magnetoresistive element is formed by stacking a ferromagnetic layer, a nonmagnetic spacer layer, and a ferromagnetic layer in sequence on the spin current transmission path composed of the magnetic anisotropy control layer.

19. The spin current signal generation element according to claim 18, wherein the ferromagnetic layer is formed in contact on the spin current transmission path composed of the magnetic anisotropy control layer, and a magnetization direction of the ferromagnetic layer is controlled.

20. The spin current signal generation element according to claim 19, wherein a plurality of spin current function elements are combined, and the magnetization direction of the ferromagnetic layer is controlled by a composition of spin currents.

21. The high-frequency detection element according to claim 20, wherein the laminate structure includes a bias ferromagnetic layer for applying a bias magnetic field, and a dc electric field and the electric field having the high-frequency component of the magnetic resonance frequency are superimposedly applied to the laminate structure to enable a detection frequency to be arbitrarily controlled.

22. A high-frequency detection element comprising:
a laminate structure in which an ultrathin ferromagnetic layer sufficiently thin so that electric field shield effect by conduction electrons does not occur and a magnetic anisotropy control layer are directly stacked on each other, and an insulation barrier layer and an electrode layer composed of a ferromagnetic layer are arranged in sequence on the ultrathin ferromagnetic layer side;

means for applying a magnetic field having a specific magnetic field application angle and magnetic field strength, to the laminate structure; and means for applying an electric field having a high-frequency component of a magnetic resonance frequency, between the magnetic anisotropy control layer and the electrode layer, wherein ferromagnetic resonance is excited by directly controlling magnetic anisotropy of the ultrathin ferromagnetic layer, and detection is performed by a dc voltage generated by combination with a tunnel magnetoresistive effect by the electrode layer composed of the ferromagnetic layer.

23. A magnetic recording device, comprising:

a perpendicularly magnetized magnetic medium layer and a magnetic anisotropy control layer directly stacked on each other, the perpendicularly magnetized magnetic medium layer being composed of an ultrathin ferromagnetic layer sufficiently thin so that an electric field shield effect by conduction electrons does not occur; and a high-frequency electric field assist head arranged on the perpendicularly magnetized magnetic medium layer side via a gap that serves as an insulation barrier layer, wherein a magnetic field having a specific magnetic field application angle and magnetic field strength is applied by a write magnetic field head, and further ferromagnetic resonance in the perpendicular magnetic medium layer an electric field having a high-frequency component of a magnetic resonance frequency is applied between the magnetic anisotropy control layer and an electrode layer which is a tip of the high-frequency electric field assist head, thereby exciting ferromagnetic resonance in the perpendicularly magnetized magnetic medium layer, and an energy barrier necessary for magnetization reversal of the perpendicularly magnetized magnetic medium is seemingly reduced, thereby reducing a write magnetization reversal magnetic field.

* * * * *